(12) United States Patent
Osann, Jr.

(10) Patent No.: US 7,062,744 B2
(45) Date of Patent: Jun. 13, 2006

(54) EMULATION SOLUTION FOR PROGRAMMABLE INSTRUCTION DSP

(76) Inventor: Robert Osann, Jr., 10494 Ann Arbor Ave., Cupertino, CA (US) 95014

( * ) Notice: Subject to any disclaimer, the term of this patent is extended or adjusted under 35 U.S.C. 154(b) by 0 days.

(21) Appl. No.: 10/655,060

(22) Filed: Sep. 3, 2003

(65) Prior Publication Data
US 2004/0073882 A1    Apr. 15, 2004

Related U.S. Application Data

(60) Provisional application No. 60/407,994, filed on Sep. 4, 2002.

(51) Int. Cl.
*G06F 17/50* (2006.01)
*G06F 9/455* (2006.01)
(52) U.S. Cl. .................. 716/16; 716/4; 716/5; 703/27
(58) Field of Classification Search .................. 716/1, 716/7–8, 15–17, 4–5; 717/124; 714/725; 703/23, 25, 27–28; 257/778
See application file for complete search history.

(56) References Cited

U.S. PATENT DOCUMENTS

| | | | | |
|---|---|---|---|---|
| 6,052,773 | A * | 4/2000 | DeHon et al. | 712/43 |
| 6,627,985 | B1 * | 9/2003 | Huppenthal et al. | 257/686 |
| 6,829,574 | B1 * | 12/2004 | Ito et al. | 703/28 |
| 2003/0192032 | A1 * | 10/2003 | Andrade et al. | 717/124 |
| 2004/0073882 | A1 * | 4/2004 | Osann, Jr. | 716/16 |

* cited by examiner

*Primary Examiner*—Paul Dinh

(57) ABSTRACT

To serve prototype and initial production requirements, an emulation solution is described where an ASIC semiconductor device die containing primarily fixed functions, for example a DSP processor with programmable instruction interface, is mounted in the same package as a conventional FPGA device—the FPGA in this example implementing custom instructions for DSP algorithm acceleration and connecting primarily to the fixed function device. A fully integrated, single die ASIC solution is then available for migration of designs to higher volume production where some of the field programmable function will be replaced with fixed function. The base wafer for the ASIC device used in the prototype package and base wafer for the volume production ASIC device may be the same.

14 Claims, 24 Drawing Sheets

Architecture Paradigm Comparison (1) • FPGAs with RISC processors added
    • FPGA cores in SOC (2) • Reprogrammable Instruction DSP

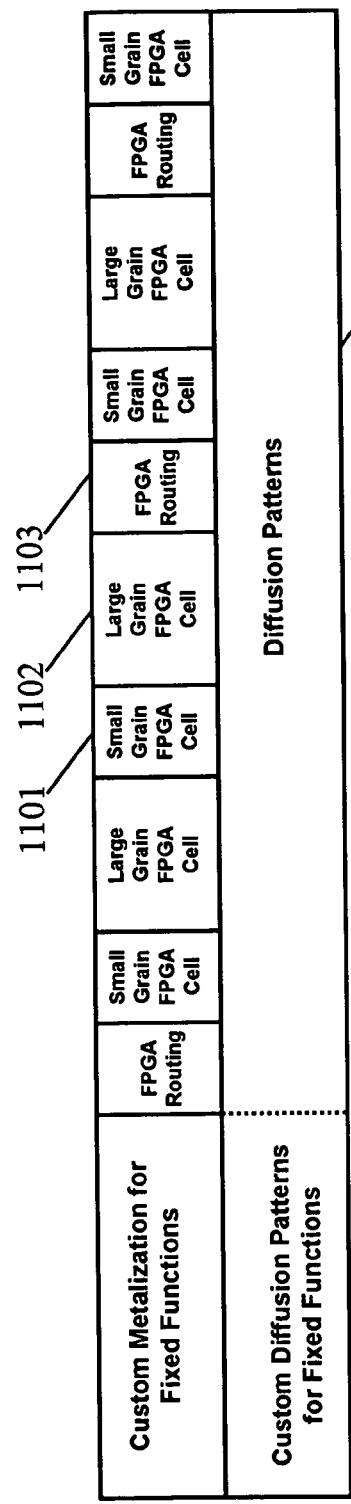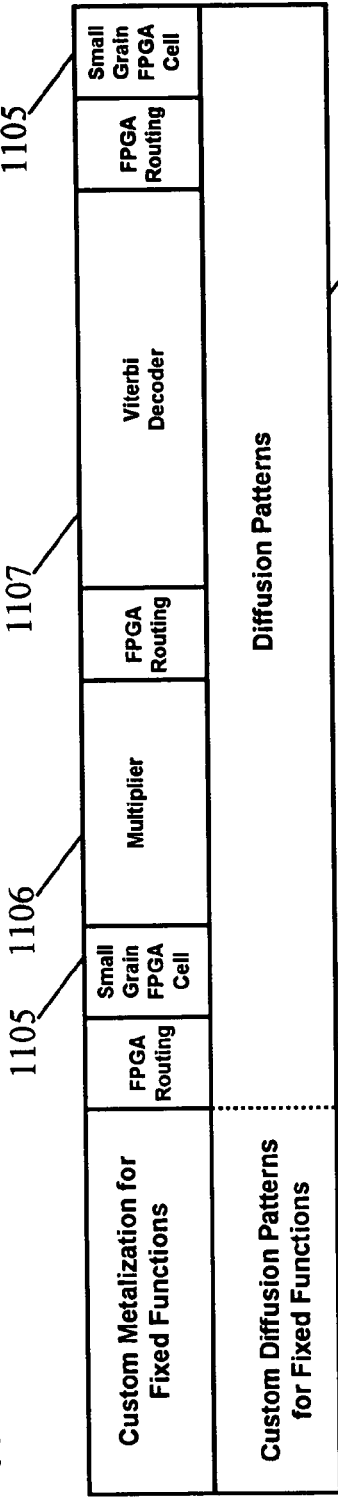
Figure 11a
Figure 11b

EMULATION SOLUTION FOR PROGRAMMABLE INSTRUCTION DSP

CROSS REFERENCE TO RELATED APPLICATIONS AND DISCLOSURES

This application claims the benefit of U.S. Provisional Application Ser. No. 60/407,994, filed on Sep. 4, 2002, and entitled "System-in-Package Solution for Programmable Instruction DSP," commonly assigned with the present invention and incorporated herein by reference.

FIELD OF THE INVENTION

This invention relates to the field of Processors and Digital Signal Processors (DSPs), ASICs, and FPGAs, and in particular, enhancements to software programmable DSPs that provide for configurability and reconfigurability of the instruction set after the device containing the DSP is shipped to the field, provision for migrating designs to lower-cost volume production implementations, and packaging solutions for combining functionalities in a flexible manner to allow emulation of production ASICs containing processors by using FPGAs to emulate the logic functionality that will be fixed in the volume production device.

BACKGROUND

Logic functionality may be configurable or programmable—these terms are essentially synonymous. Programmability or configurability may be performed at the semiconductor foundry where it is also said to be mask-programmable resulting in a hard-wired function after configuration. Programmability may also be field-programmable where a device may be programmed after delivery to the user. Field-programmable logic devices may also be re-programmable where the logic function may be changed from time-to-time in the field after purchase. Processors are said to be software programmable where a program in memory can be changed to alter the functionality, however, for most processors, their basic hardware logic function and instruction set is fixed of hard-wired.

Historically, DSP functionality has taken two forms: software programmable processors with arithmetically oriented instruction sets such as those offered by TI, Analog Devices, Motorola, and Agere (Lucent), and dedicated logic hardware functionality specifically performing arithmetic tasks. In recent years, an alternative approach to programmable DSP functionality has arisen where arrays of arithmetically oriented function modules are connected by repro-grammable routing resources, in a manner similar to that utilized in Field Programmable Gate Arrays (FPGAs), creating reprogrammable array DSP solutions. Reprogrammable array DSP solutions are being offered by companies like PACT, Leopard Logic, and Elixent as embeddable cores and by Chameleon as a discrete component. A core is an embeddable block of semiconductor functionality that can be included in a System-On-Chip (SOC) ASIC (Application Specific Integrated Circuit) design. These reprogrammable array DSP solutions always operate independently of any classical software programmable DSP architecture.

Meanwhile a different evolution in processor architecture has occurred for RISC (Reduced Instruction Set Computer) processors where synthesizeable processor cores are being offered by companies like ARC and Tensilica with the ability to customize instruction set extensions. Variations on these processors are also offered with multiplier-accumulator functions added enabling DSP applications to be better addressed. However, these processor cores are only customizable at the time the logic function is synthesized—which means some time prior to the construction of actual silicon. Their instruction set cannot be altered or reconfigured once the silicon implementation has been fabricated.

At the same time, it has been shown by companies such as ARC and Tensilica that the ability to create customized instructions can greatly improve the performance of a processor. Unfortunately, since these instructions are not alterable in the field (once the processor has been delivered to the customer) they cannot adapt to the surprises that arise when real-world phenomena are encountered upon powering-up the first prototype. Such discrepancies are even more prevalent for DSPs since they often deal with real-world phenomena like voice and video, and noisy communications mediums like cable modems, DSL, and wireless where unpredictability is inherent.

A research project summary presented at the Instat/MDR Embedded Processor Forum (Apr. 29, 2002) by Francesco Lertora, a System Architect at ST Microelectronics, had some similarities to the present invention. It was entitled "A Customized Processor for Face Recognition" and demonstrated a custom processor based on Tensilica's Xtensa processor core. Here, they coupled the configurable (not field programmable) instruction extensions of the Tensilica processor to a block of FPGA technology on a custom SOC design. To augment the Tensilica processor, they implemented arithmetic functions in the FPGA to perform DSP-type functions. In this example, the FPGA functionality not only performs operations where results are returned to the RISC processor, it also performs some I/O functions directly, essentially functioning at times as a coprocessor. While not combining a conventional DSP with an FPGA fabric in a tightly-coupled and dedicated manner with the FPGA subordinate to the conventional DSP as embodied in the present invention, this demonstration by ST does reveal some of the benefits of a processor with re-programmable instructions since it was able to considerably accelerate the required functionality. However, ST's chip designers gave in to the temptation to allow the FPGA to perform functions independently. In general, this adds a substantial amount of hardware dependence to the design flow, making it far more difficult for designers to use. DSP designers typically prefer to design in a high-level language like C and not have to deal with hardware dependencies. As soon as the FPGA is allowed to execute tasks in parallel with the conventional software programmable DSP, the overall DSP program must be partitioned into parallel tasks, a complex issue involving intimate knowledge of the hardware.

Another company that has discussed FPGA fabric performing instruction is GateChange. However, the proposed architecture includes an ARM (RISC) processor and also allows the FPGA fabric full co-processing capability, with complete access to the device's I/Os—certainly not constraining the FPGA fabric to be fully subordinate to the DSP as in the present invention.

FPGAs have been used for years to construct dedicated DSP functionality, sometimes in conjunction with a conventional DSP but operating as a separate functional element. In recent years, some FPGA suppliers like Xilinx and Altera have added dedicated multiplier functions. These essentially create a heterogeneous fabric where most of the modules are conventional Look-Up Table (LUT) based programmable modules, and some are fixed multiplier functions. This has made these devices more effective in terms of performance and density when arithmetic (DSP) functions are performed in dedicated hardware. These same FPGA suppliers now also offer RISC processors embedded in their FPGA devices. However, their FPGA functionality is not constrained to be subordinate to the processor—in fact their paradigm is just the opposite, with the processor acting as an enhancement to the FPGA function.

It is a generally accepted fact that for conventional, software programmable DSPs, less than 10% of the code often accounts for more than 90% of the execution cycles. It therefore follows that if a software programmable DSP were created with a field-configurable (field-programmable) instruction set, where dedicated functions with a high degree of parallelism can be applied to perform the functions consuming 90% of the cycles, the overall processor performance could be increased significantly.

However, a software programmable DSP with a field programmable instruction set does not exist. It appears that when reprogrammable array DSP solutions are developed, the creators are determined that this technology alone is the solution to the problem and it should be used as a separate functional entity from the conventional software programmable DSP. As offered, reprogrammable array DSP solutions are used for all DSP functions including the large quantity of instructions that normally occupy only 10% of the execution cycles. Unfortunately, this focus ignores the paradigm that exists for DSP development and the fact that DSP programmers—who are typically software engineers with an expertise in math—prefer to work in a software environment without having to be concerned with hardware uniqueness. Reprogrammable array DSP solutions do not fit cleanly into the flow that DSP programmers prefer to use. A software programmable DSP with a field programmable instruction set, on the other hand, would fit well—and increase processor performance significantly at the same time.

Unfortunately, any FPGA fabric that might be used in these solutions consumes between 20 and 40 times as much silicon area as the standard-cell ASIC implementations normally used in SOC design and at least 10× to 20× as much silicon area as a Gate Array implementation. Therefore, after a design initially implemented in FPGA has reached production and proven to be stable, it is often desirable to convert the design to an ASIC fabric of some kind. However, migrating an FPGA design to a lower-cost ASIC implementation is known to be fraught with timing and testability problems. It is known that these problems can be eliminated if designs are synchronous with a common clock, however in the current development paradigm for FPGAs, this restriction cannot be enforced. As long as hardware designers can add any arbitrary function to an FPGA, these migration problems will persist.

Someday, it may be viable from a cost perspective to use reprogrammable technology for volume production. However, in the meantime, there is a need for DSP solutions that take advantage of flexibility benefits of FPGA technology for development and market entry, while also providing an effective and practical solution for volume production.

Also, when FPGA devices are currently used in conjunction with conventional DSP processors, designers must deal with a two-chip solution along with the inherent partitioning and hardware issues, as well as the complexities of debugging two separate devices requiring different debug methodologies for each. DSP designers, who are typically software engineers with math backgrounds as opposed to hardware design, are accustomed to debugging conventional software-programmable DSPs with a software debugging program. These situations create a need for an integrated DSP processor/FPGA solution where the two are integrated together from a silicon standpoint, including an integrated debugging methodology where the conventional software "debugger environment" is extended to include the FPGA or ASIC arithmetic fabric that is serving the purpose of accelerating specific algorithms.

A DSP device with integrated FPGA functionality does not exist today, and while integrating the two technologies on a single die is desirable, an alternative would be to combine two die in a single package to serve prototyping and initial production applications. Modern IC packaging solutions can make this viable by allowing the creation of a System-in-Package (SIP) solution where two (or more) die are integrated into a single integrated circuit package. This type of solution would be useful anywhere fixed functionality, in particular processors, are used in both the prototype and volume production solution, and where it is desirable to have a prototype and initial production solution that also includes logic that is field programmable.

SUMMARY

A software programmable DSP with a field programmable instruction set is described where customized instructions can be created, or certain existing instructions can be modified, at the user's location after taking delivery of the processor. The FPGA fabric used to implement the reprogrammable instructions is restricted to supporting the software-programmable DSP—never functioning as an independent coprocessor—and therefore enabling the reprogrammable instructions to exist in the normal stream of DSP software execution.

Alternative architectures are shown for implementing the reprogrammable portion of the processor, including homogeneous, heterogeneous, and application-specific arrays of FPGA-style function modules and associated programmable interconnect. A method for creating instruction sets optimized for different applications is disclosed. Designs implemented on a die containing a DSP with an FPGA-style reprogrammable instruction fabric may also be migrated to a smaller die within a family of DSP die containing hard-wired ASIC instruction fabrics.

To serve prototype and initial production requirements, an emulation solution is described where an ASIC device die containing primarily fixed functions, for example a DSP processor with programmable instruction interface, is mounted in the same package as a conventional FPGA device—the FPGA in this example implementing custom instructions for DSP algorithm acceleration. A fully integrated, single die ASIC solution is then available for migration of designs to higher volume production where some of the field programmable function will be replaced with fixed function. The base wafer for the ASIC device used in the prototype package and base wafer for the volume production ASIC device may be the same.

BRIEF DESCRIPTION OF THE DRAWINGS

The present invention is described with respect to particular exemplary embodiments thereof and reference is accordingly made to the drawings in which:

FIG. 11a shows a cross-section diagram where the functions implementing reprogrammable DSP instructions are constructed using a heterogeneous FPGA fabric.

FIG. 11b shows a cross-section diagram where the functions implementing reprogrammable DSP instructions are constructed using an application-specific FPGA fabric.

DETAILED DESCRIPTION OF THE INVENTION

Figure 1:
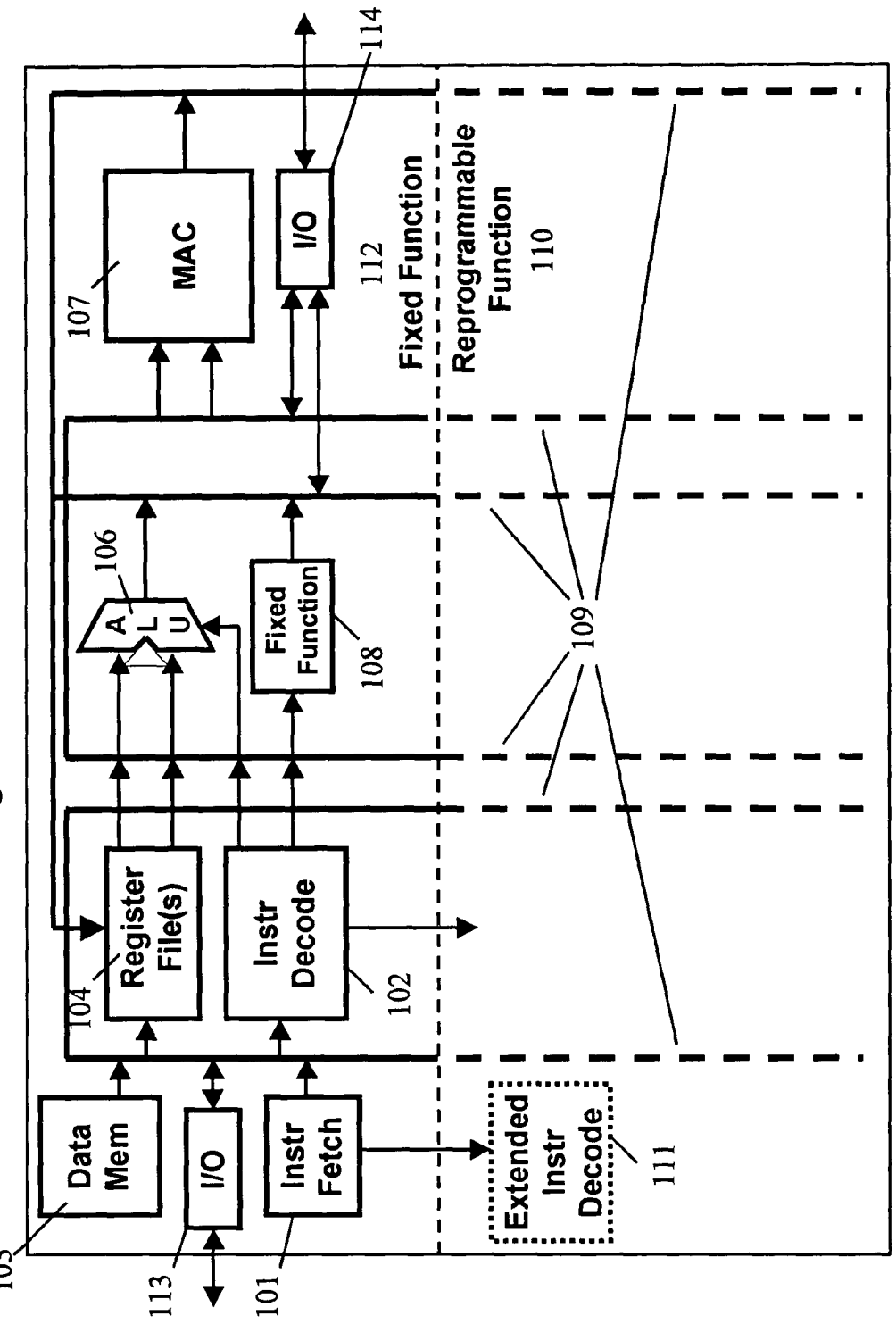
FIG. 1 shows a block diagram for a DSP having field-reprogrammable extensions to its instruction set.

The basic concept showing the instruction set of a DSP being expanded to include instruction functionality that can be reprogrammed in the field is shown in FIG. 1. Here, a simple DSP architecture resides in a fixed function implementation and includes instruction fetch 101, instruction decode 102, data memory 103, register files 104, ALU 106, MAC 107, and other miscellaneous fixed functions 108. Various busses 109 connect from the fixed function area of the processor 112 into the reprogrammable function area 110 as shown. In addition, provision is made for the extension of the instruction decode into the reprogrammable area by way of extended instruction decode 111. Also, instruction decode 102 can provide additional control signals for use in reprogrammable function 110.

Note especially that reprogrammable function 110 is strictly subordinate to the conventional fixed-function (software-programmable only) DSP function 112. All I/O functions 113 and 114 are done through the structure of DSP function 112. This distinction is important as all prior art examples combining processors and reprogrammable logic (FPGA) function, allow the FPGA to operate independently of the conventional DSP processor, often including communication directly with I/O independent of the software flow. This parallelism and/or coprocessing adds a complexity to the overall design flow that becomes a barrier to adoption, especially since most DSP users today are software engineers with math degrees—not electrical engineers. It is therefore critical for ease-of-use that operations performed by reprogrammable function 114 remain within the sequence of execution prescribed by the DSP software program being executed. If the execution time for a particular FPGA function requires multiple clock cycles for execution, the DSP will wait for the results before proceeding. Normal house-keeping functions (cache management, pre-fetch, pipeline movement) may continue, but relative to the programmed instruction flow, the DSP will essentially be in a "wait-state" while the FPGA performs its function.

The above restriction is therefore unique in providing an overall solution where the FPGA fabric executes functions that replace normal software subroutines, without disturbing the flow of the DSP software program. If the reprogrammable fabric (FPGA) is allowed to execute functions independently and therefor concurrently, the programming sequence will be significantly complicated, becoming a deterrent to adoption of the technology by DSP engineers who today, use only conventional, software programmable DSP devices.

Figure 2:
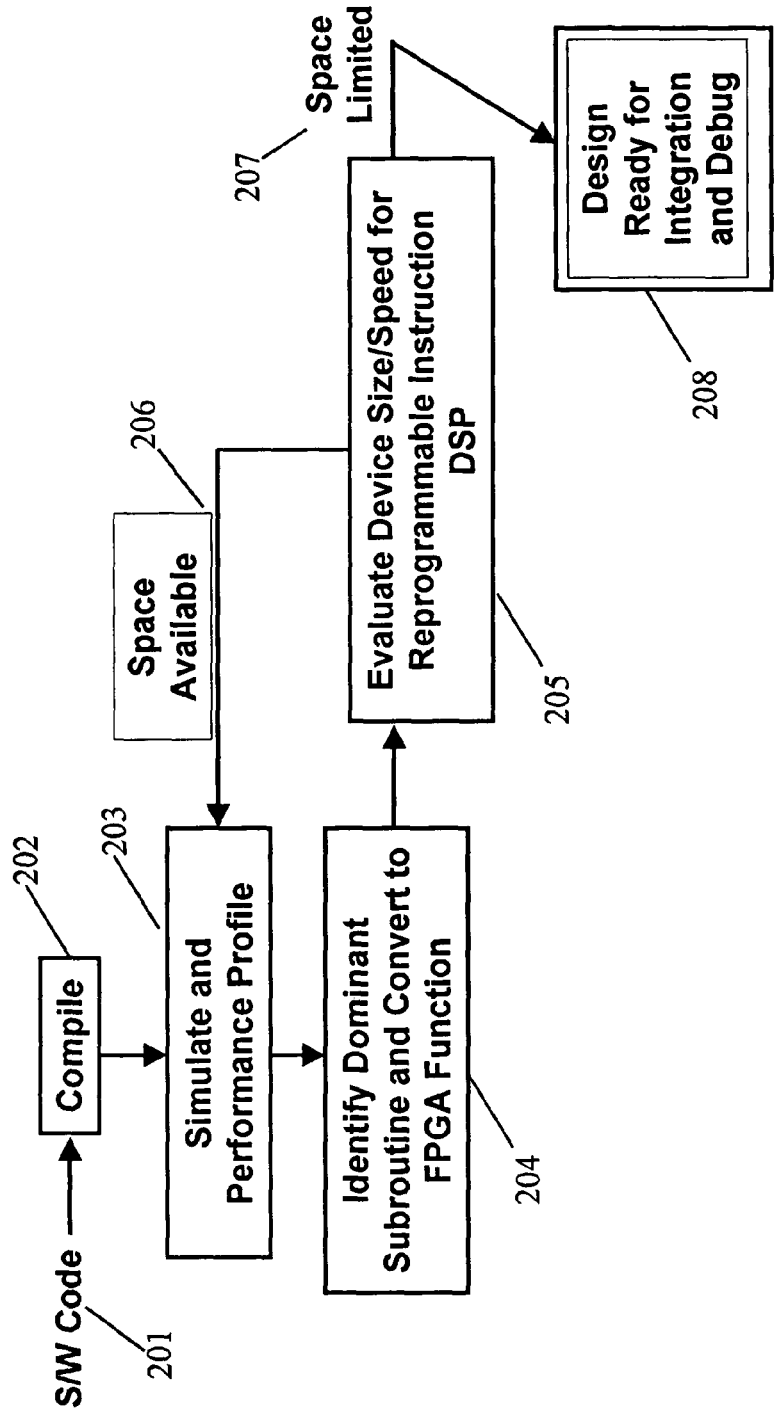
FIG. 2 shows a flow-chart for the development process using reprogrammable instruction DSPs.

FIG. 2 shows the design flow for a Reprogrammable Instruction DSP (rDSP). First, software code 201 is compiled 202 and then goes to a process of simulation and performance profiling 203. Then, as a result of profiling and determining which subroutines are dominating the processor's execution time, that subroutine which consumes the largest percentage of processor run time is isolated and converted 204 to FPGA functionality for implementation in the reprogrammable function area of the rDSP.

The process of step 204, where a subroutine is converted from software code to hardware functionality may be restricted, according to this invention, to be a fully machine-controlled step. This means that the actual hardware description created is a result of the software tool performing the conversion from the software DSP code, with no opportunity for the user to introduce additional functionalities or hardware irregularities into the process. This is critically important to enable the smooth migration from an rDSP with FPGA fabric to an rDSP with a hard-wired ASIC (gate array or standard cell) fabric, as described later in FIGS. 15–18. If hardware designers have a way to introduce any hardware functionality, in addition to what is absolutely necessary to accelerate the most time consuming DSP algorithms, it opens the door to designs that have timing and testability problems when migrated to an ASIC fabric. Tools exist that support implementations on ASIC and FPGA fabric where the functionality is originally described in a high-level software language such as C. The majority of these produce an intermediate level description that is some form of HDL (Hardware Design Language) such as Verilog or VHDL. This offers the opportunity for hardware designers to add to or modify the primary DSP algorithm functionality, thus creating an opportunity for the insertion of design elements that would produce timing or testability problems when further synthesized to an ASIC implementation. The preferred design flow would not offer this opportunity.

Next, the overall performance of the DSP, including both software-programmable conventional DSP function and the reprogrammable FPGA function is evaluated 205. Simultaneously, evaluation step 205 also includes a comparison of the (silicon area) size required for the reprogrammable function relative to the reprogrammable area available in the various members of the rDSP family. If there is significant space still available in the family member that currently can contain the FPGA functionality defined so far, the process of profiling and converting will continue 206. Simulation and performance profiling 203 will be performed again, followed by subroutine identification and conversion 204, and then further size and speed evaluation 205. Finally, when the performance requirement has been met, and/or the current member of the rDSP family containing the FPGA functionality has limited space 207 to add additional functionality, the overall rDSP design is declared ready for implementation, integration, and debug 208. Of course, if the performance requirement has not been met, the user can decide to target the design at the next larger rDSP in the family, thereby making more space available for FPGA-based instruction functionality and allowing the profiling and conversion process to continue further.

Figure 3:
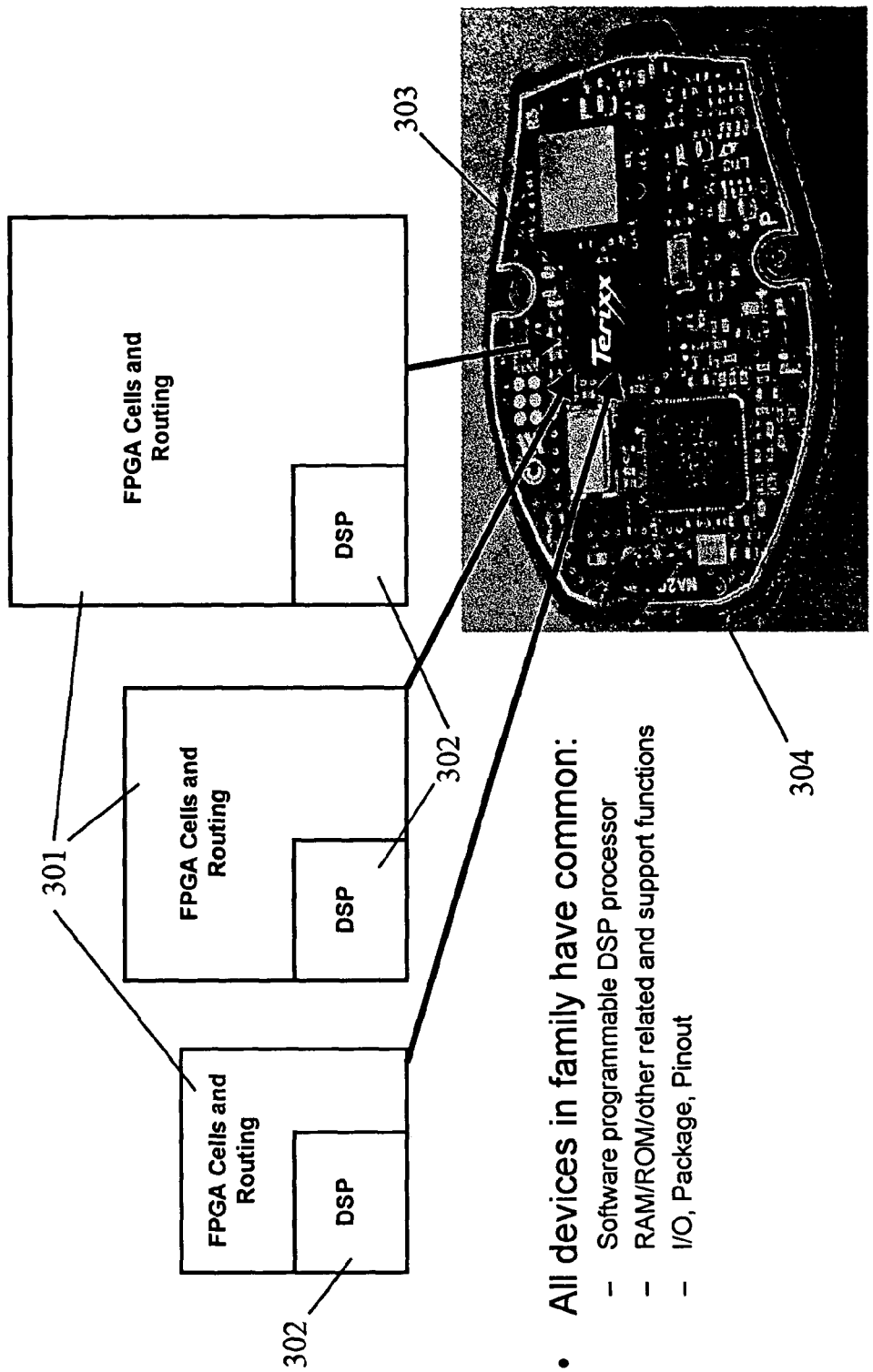
FIG. 3 shows how a family of reprogrammable instruction DSPs, with different amounts for FPGA fabric, can function identically in the same application.

An example of a family of rDSPs is shown in FIG. 3. Here, three devices are shown, each containing identical conventional DSP functionality 302 including supporting functions like timers, RAM and ROM. The primary difference between the three members of the family shown occurs in the amount of FPGA fabric 301 included. Otherwise, all members within a given family of rDSPs are identical. Execution time for the conventional DSP functionality 302 will be the same across the family. However, the overall performance of a given device will be affected by the longest critical path in the FPGA functionality.

All devices in the family also have identical I/O functionality and are therefore capable of plugging into the same socket 303 in user system 304. Note that since the rDSP is first and foremost a DSP, the rDSP I/O functions are like that of conventional software programmable DSPs such as those manufactured by TI, Agere, Motorola, and Analog Devices. In fact, the exact I/O pinout (function and pin number assignment) configuration may be identical to a popular, high-performance DSP, such as the TMS320C64 series from TI. I/Os for rDSPs are not general-purpose, multi-standard I/Os such as those found on FPGAs. rDSP I/O functions can be smaller and simpler than typical FPGA I/Os since they are targeted specifically for applications normally performed by conventional DSPs.

Also, it should be noted that within any family of conventional FPGA devices, such as those manufactured by Xilinx and Altera, the number of signal I/O pads on the various die within a product family always increases as the die size increases. This is consistent with the conventional FPGA being a general purpose device. The larger the FPGA die size, the more room on the periphery to add signal I/Os, so they do. The rDSP is different. Although there is more room in the periphery of the larger rDSP die to place more I/Os, this is specifically not done. The number of signal I/Os is constant so that all members of the rDSP family, as well as the similar rDSP family with hard-wired arithmetic fabric, can operate properly when inserted in the same device socket on a user's PCB.

Figure 3A:
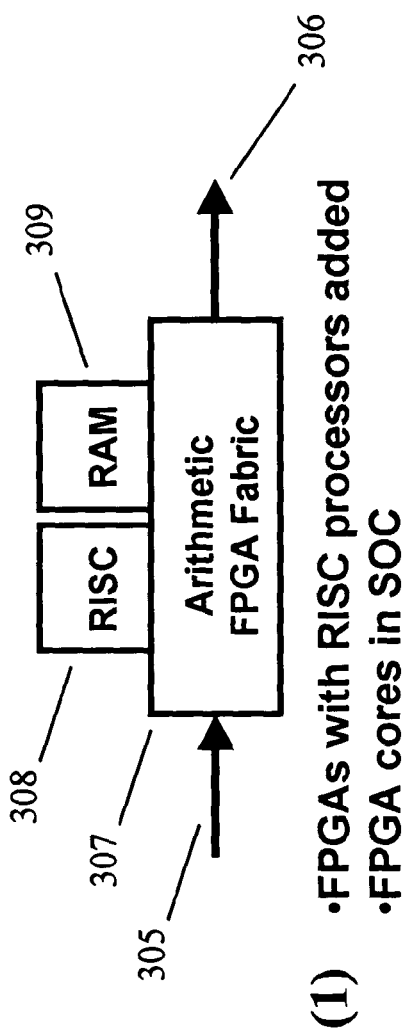
FIG. 3a shows how the architectural paradigm for rDSPs compares with that of conventional FPGA devices, as well as FPFA fabrics used as IP cores within SOC designs.
Figure 3A:
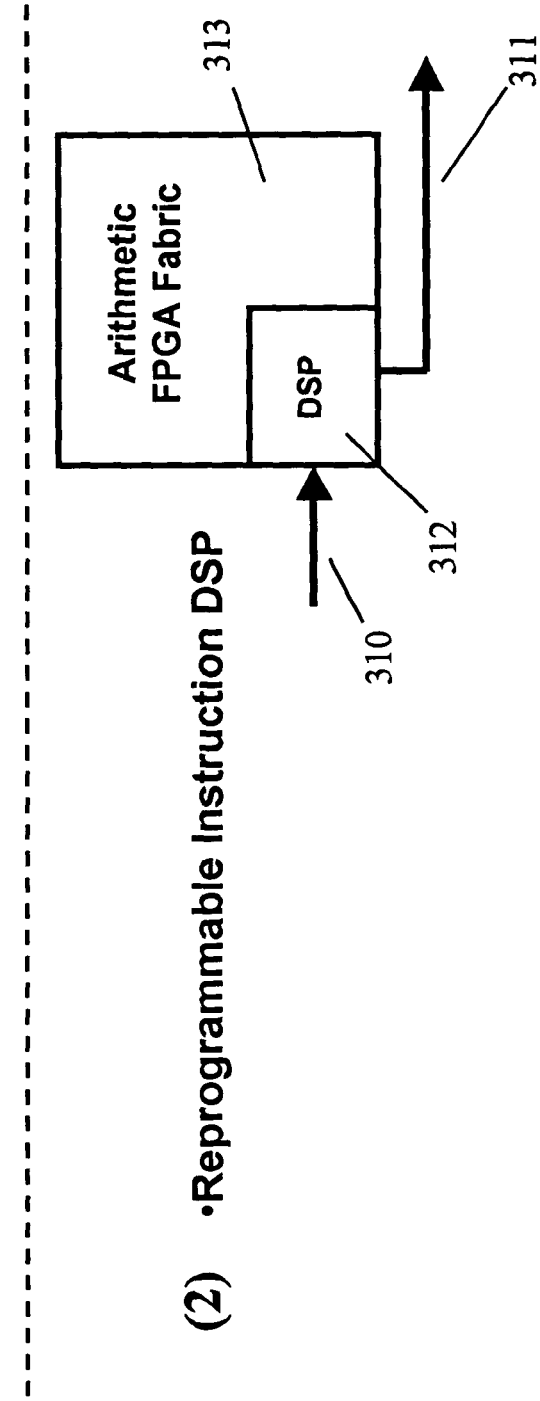

FIG. 3a shows how the architectural paradigm for rDSPs (diagram 2) varies from the typical architectural arrangement for FPGA devices and FPGA fabrics used in SOC (diagram 1). In diagram 1 of FIG. 3a, I/Os 305 and 306 are tied directly to the FPGA fabric and not to a RISC processor 308 or RAM 309 that may also be attached. Here, the FPGA is the central focus. In contrast to this, diagram (2) shows how I/Os 310 and 311 for the rDSP are connected to the conventional software programmable DSP 312, and not to the FPGA fabric 313. This supports the paradigm where the rDSP is the master with the FPGA fabric subordinate to the DSP.

Figure 4:
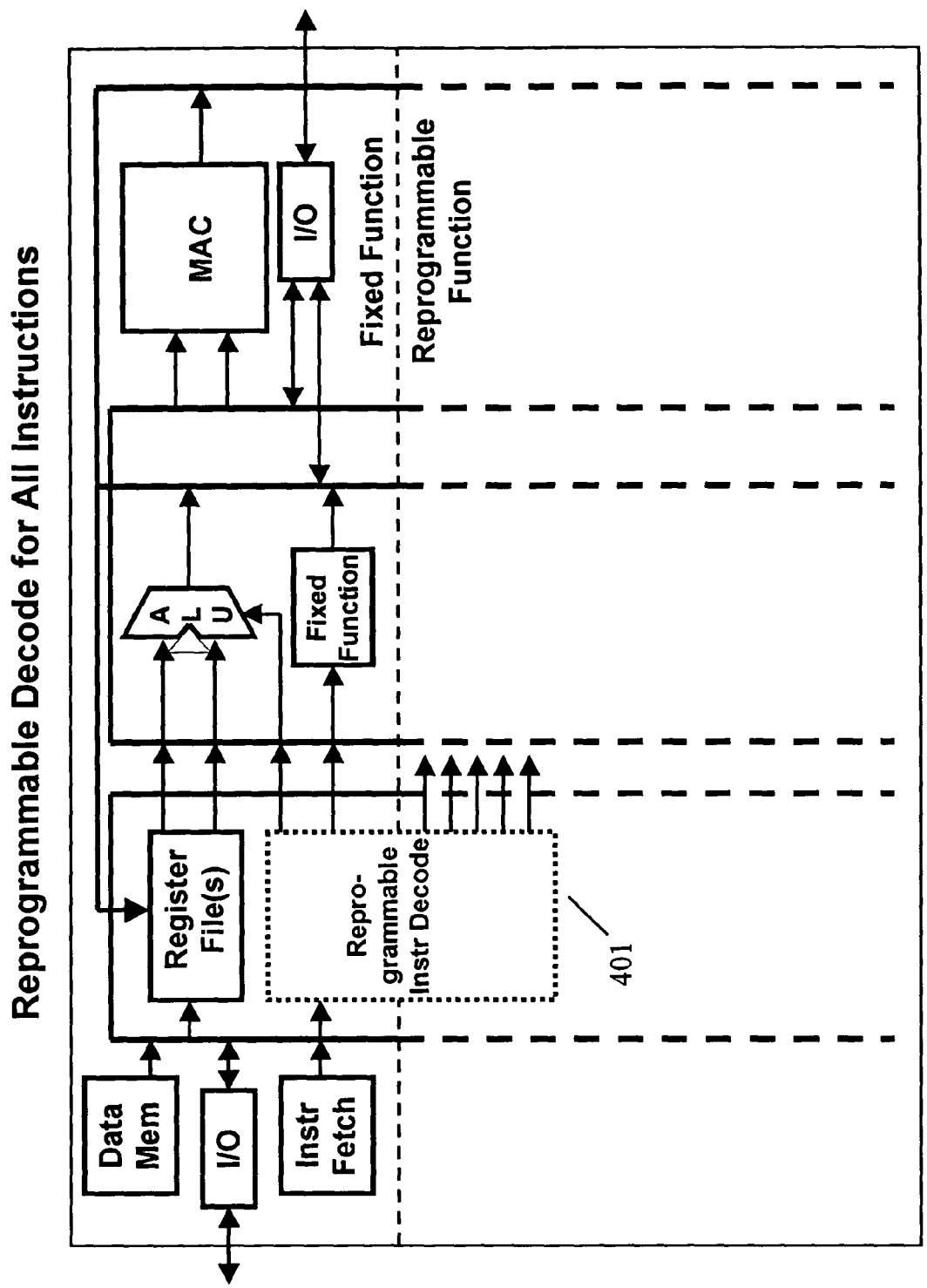
FIG. 4 shows a block diagram for a DSP having a reprogrammable instruction set including a reprogrammable instruction decode and controller block.

An alternative implementation for the instruction decode mechanism of FIG. 1 is shown in FIG. 4 where reprogrammable instruction decode block 401 performs instruction decode for the entire DSP including functions located within the fixed function area. This allows the operation of fixed functions to be coordinated with the operation of reprogrammable functions in order to maximize utilization of all available functions once the reprogrammable instructions have been defined.

Figure 5:
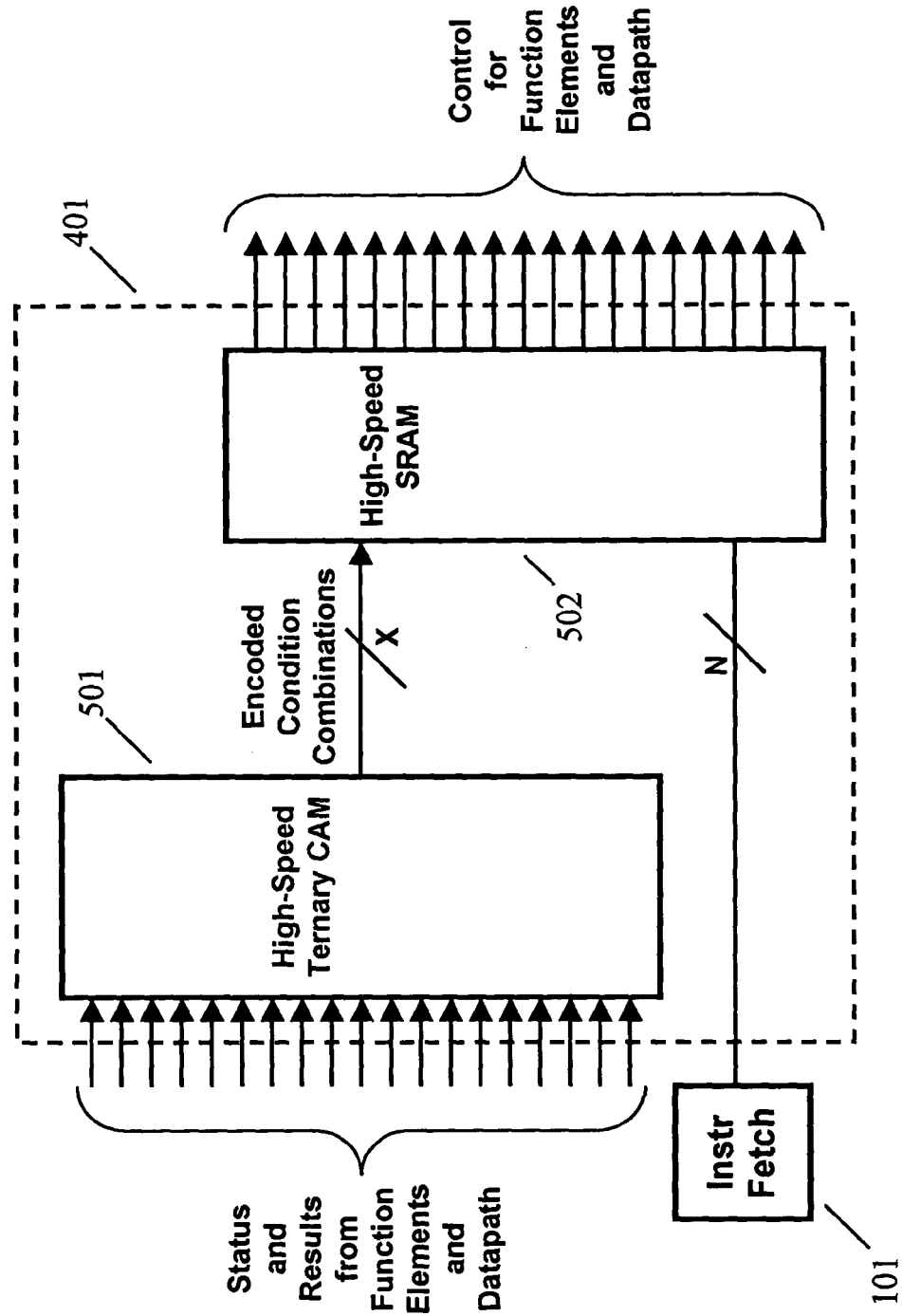
FIG. 5 shows a possible implementation for the reprogrammable instruction decoder and controller of FIG. 4.

A more detailed view of one particular implementation of reprogrammable instruction decode block 401 of FIG. 4 is shown in FIG. 5. In this unique implementation, a high-speed ternary CAM 501 (Content Addressable Memory) is used to decode status and results signals coming from the various function elements and data path elements that exist within the processor. Here, unique combinations of these status and results signals are detected and subsequently encoded in the X bits that comprise the outputs of the CAM.

The outputs of CAM 501 are connected to some of the address inputs of high-speed SRAM 502. The other address inputs of high-speed SRAM 502 are connected to the stream of instructions coming from instruction fetch unit 101. Note that the instruction stream from fetch unit 101 is already encoded and therefore works well when connected to the address inputs of a conventional memory such as SRAM 502. Also note that any data paths necessary to load (initialize) CAM 501 or SRAM 502 are not shown here for the sake of simplicity.

Ternary CAM 501 provides the capability of decoding a relatively small number of conditions from a large field of bits, and then creating an encoded representation of each input condition. SRAM 502 possesses the capability of producing any combination of output values for all possible combinations of inputs. The unique combination of ternary CAM 501 feeding high-speed SRAM 502 provides a maximum degree of flexibility and re-programmability with a minimal use of silicon area while retaining reasonably fast performance. Although not shown in FIG. 5, a pipeline register may be placed between CAM 501 and SRAM 502 if it is appropriate given the overall timing scheme within the processor.

Figure 6:
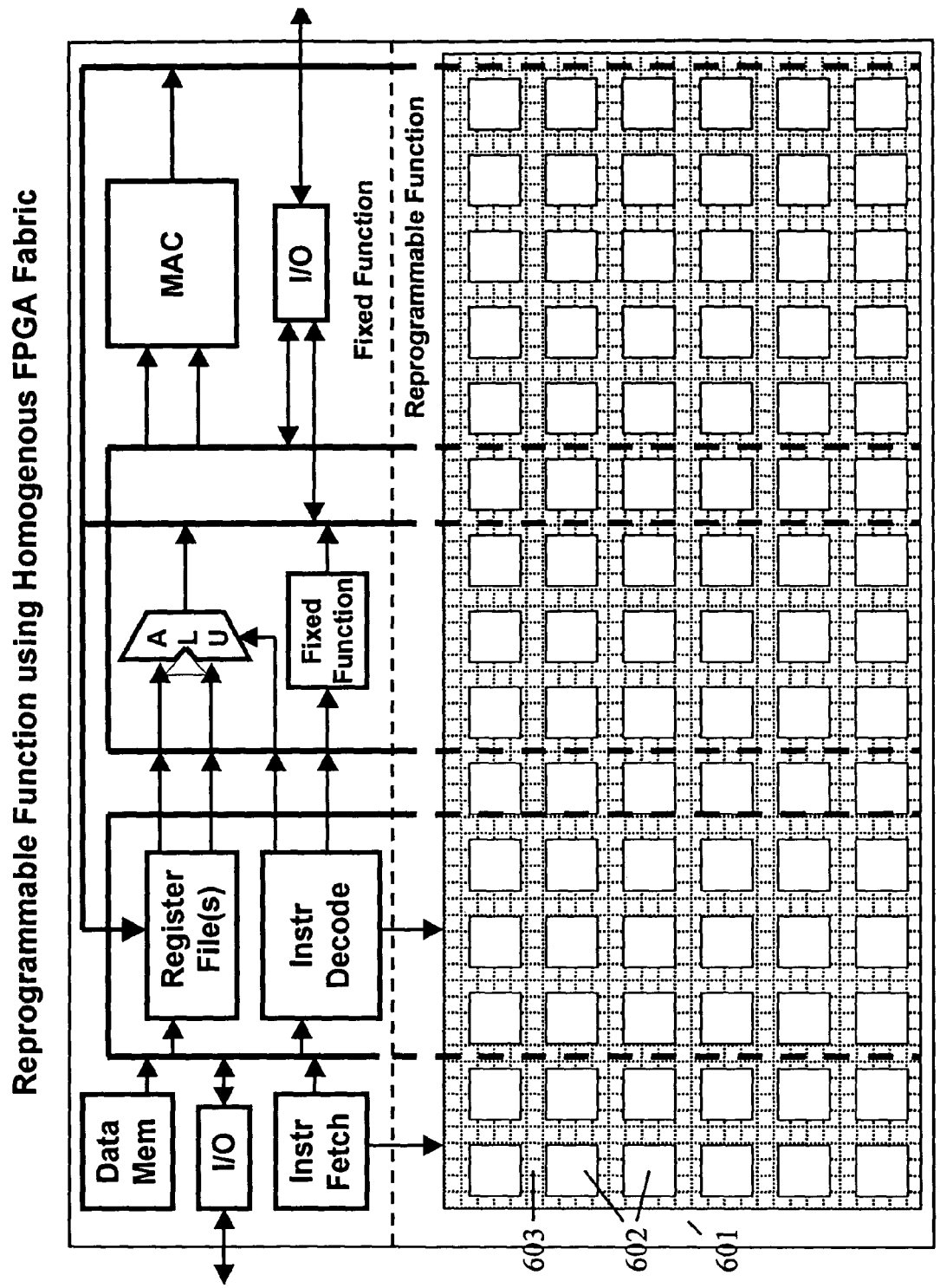
FIG. 6 shows how reprogrammable instructions can be implemented using a homogeneous FPGA fabric.

FIG. 6 shows a DSP including an area of reprogrammable function for constructing reprogrammable instruction execution functionality. Note that, as mentioned earlier, a "reprogrammable instruction" is a function implemented in the FPGA fabric (possibly working in conjunction with functionality in the fixed conventional DSP processor) that typically replaces a subroutine, or string of instructions, that would otherwise be executed by the conventional, software-programmable DSP. To implement a reprogrammable instruction according to FIG. 6, the re-programmable function is implemented in a homogeneous FPGA fabric 601 where all reprogrammable function modules 602 are the same. Usually, an FPGA function module contains a cell for generating combinational logic function and some type of flip-flop or latch that can either be used when needed for storage, or alternately bypassed when not needed.

FPGA function modules are typically connected together with a matrix 603 of reprogrammable switches and routing wires, sometimes mixed with muxes, and controlled by reprogrammable memory cells. Such FPGA architectures are well known in the art and are contained in devices manufactured by Xilinx, Altera, and others. In some FPGA architectures, the function modules themselves can be programmed to implement one of a number of possible logic functions. For FPGAs typically manufactured by Xilinx and Altera, this is implemented with RAM/Mux-based Look-Up Tables (LUTs). Other FPGA architectures exist where the function modules themselves may not be programmable—variations in combinational logic functionality are instead obtained by the manner in which signals are connected to the modules. For these architectures—basically consisting of arrays of muxes—any logic function can be achieved according to how the muxes are connected together. Regardless of the particular module type chosen, a homogeneous array has identical cells (each typically capable of combinational and sequential function), repeated across the array. A homogeneous array is the most regular and therefore the easiest to support with automatic placement and routing software. However, since the modules are the most general purpose, the array they comprise will typically consume the most silicon area and have the lowest performance.

Figure 7:
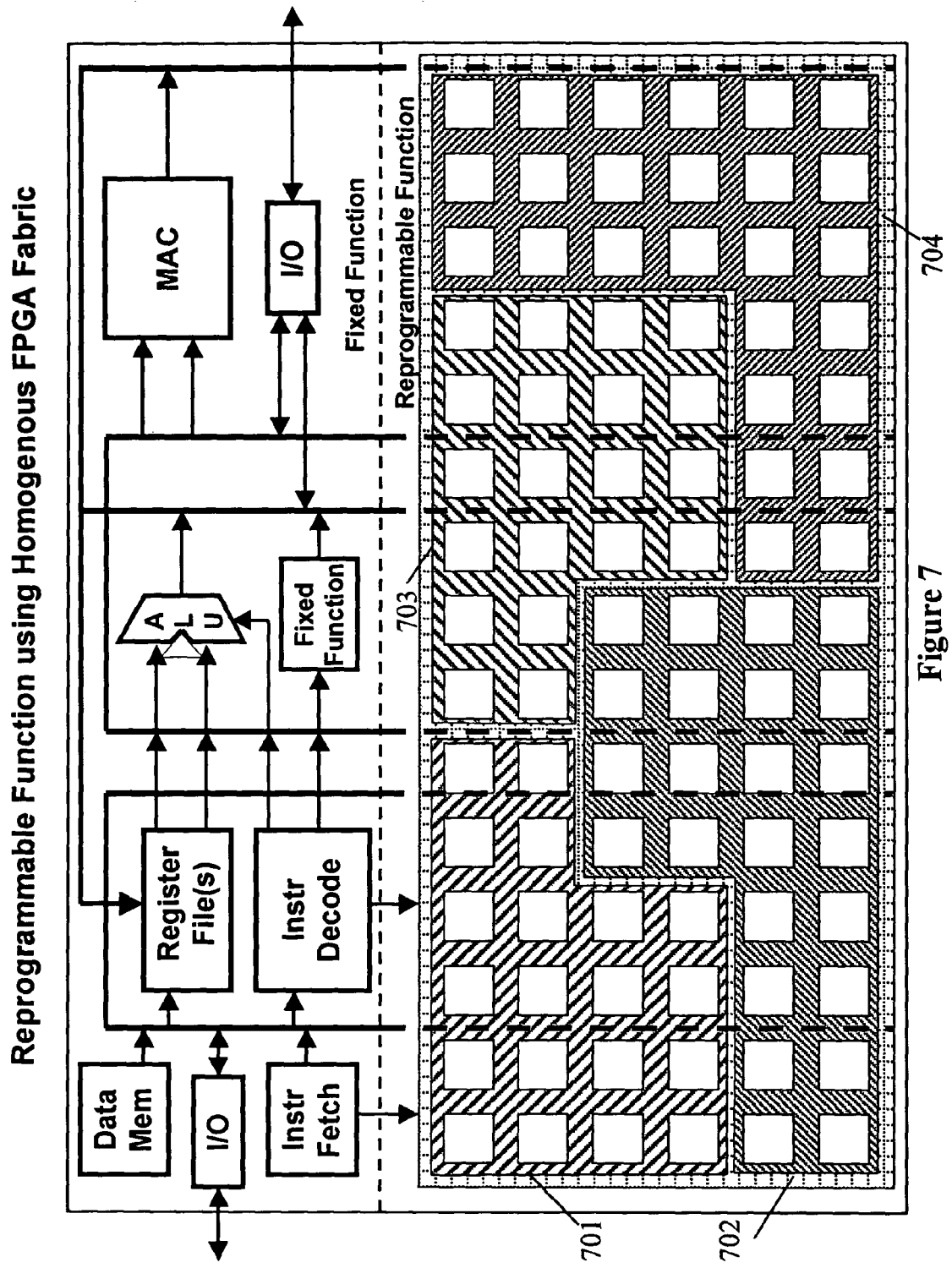
FIG. 7 shows how four reprogrammable instructions are implemented using the FPGA fabric of FIG. 6 where each of the four requires approximately the same amount of hardware function.

FIG. 7 shows the DSP architecture of FIG. 6 where four different re-configurable instructions have been constructed by allocating approximately equal areas (701, 702, 703, and 704) of the FPGA fabric. Although it is not likely that such relatively equal areas would be used, this example is meant to show the contrast with FIG. 8 where a significantly larger amount of silicon area is allocated to instruction 801 than is allocated to instruction 802. Note that although not shown here, the areas that comprise functionality for different instructions may overlap.

Note that it is also possible to share the FPGA fabric among multiple instructions. This is made possible by the operation of the programmable instruction decode and control function (if present) that can be programmed to utilize various functions formed from the FPGA fabric to participate in the execution of more than one instruction.

Figure 8:
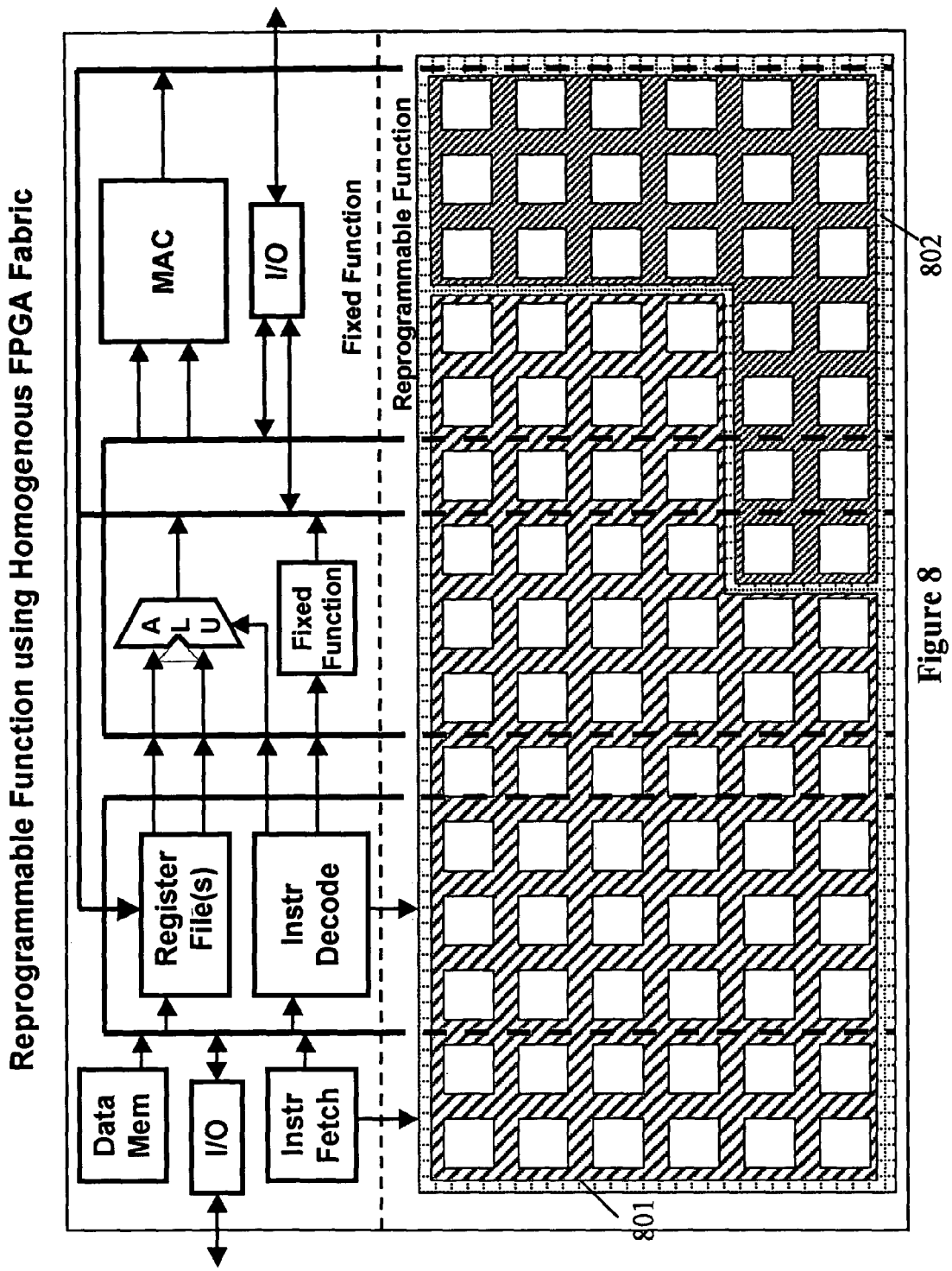
FIG. 8 shows how two reprogrammable instructions are implemented using the FPGA fabric of FIG. 6 where one of the two requires a significantly larger amount of hardware function.
Figure 9:
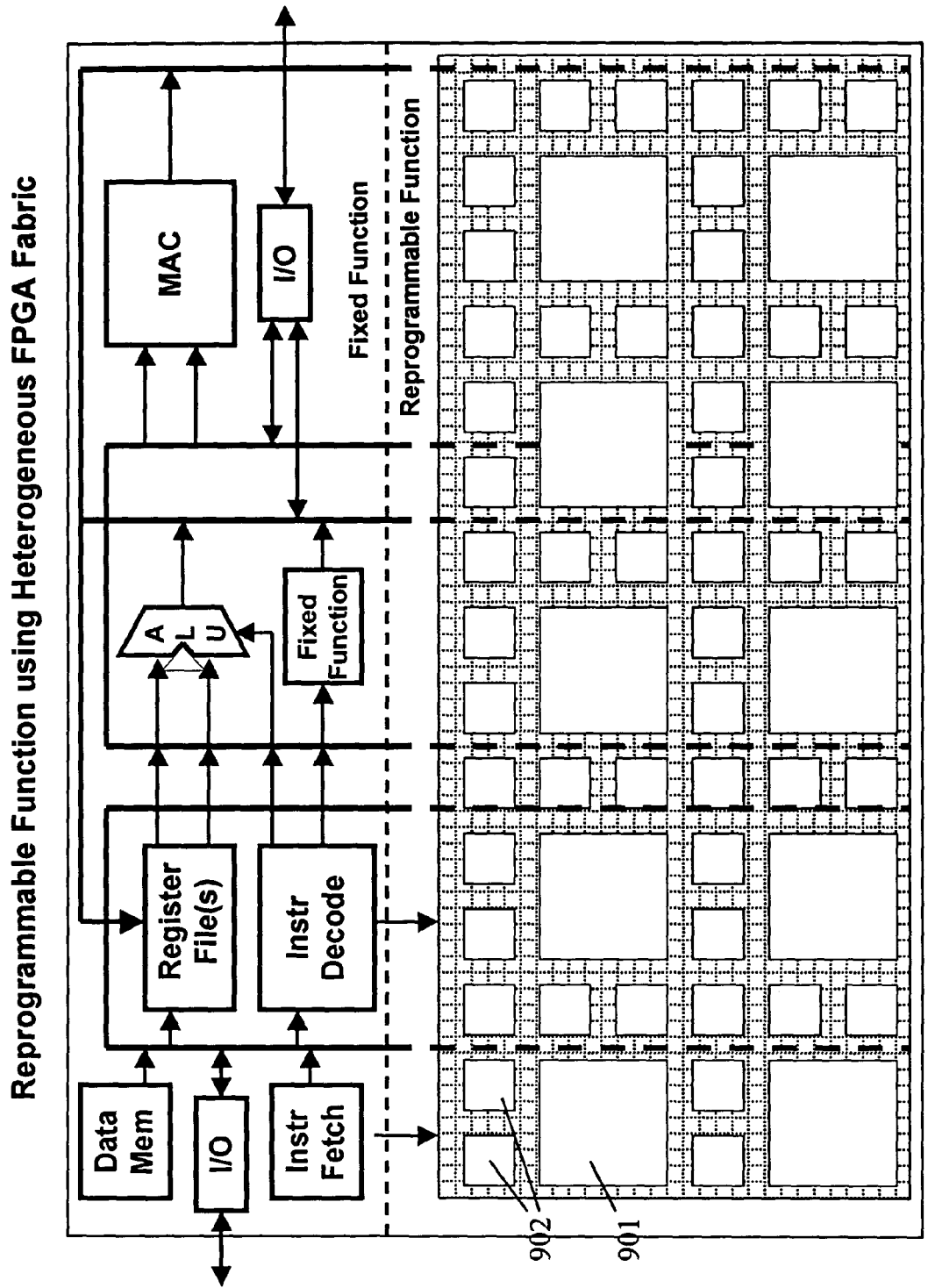
FIG. 9 shows a block diagram for DSP and where reprogrammable instructions are implemented using a heterogeneous FPGA fabric where function modules of different sizes are mixed together in a regular pattern.

FIG. 9 shows an alternative architecture where the reprogrammable instruction functionality is implemented with a heterogeneous FPGA fabric. This fabric, like that of FIGS. 7 and 8 is still general purpose, but has a mixture of function modules having different amounts and/or styles of logic. Notice that module 901 is shown significantly larger than module 902. There could be a number of reasons for this size difference depending on the strategy that has been chosen for the architecture definition. This difference could be the result of module 901 containing a larger LUT or Mux than module 902, or even a larger number of LUTs or Multiplexers (if multiple numbers of LUTs or Multiplexers are used per module). The difference between 901 and 902 could also be due to 901 containing more arithmetic functionality, since many DSP instructions are of an arithmetic nature. Regarding arithmetic functions, module 901 could also contain a multiplier, a multiplier accumulator (MAC), or a MAC where the accumulator can be bypassed if only the multiplier is required.

While the FPGA fabric of FIG. 9 is shown with a specific ratio of large grain to small grain FPGA logic modules, the ratio may vary as required by different classes of application, or alternately, the best overall ratio for all DSP applications may be a different number. For instance, if the larger module 901 contains a multiplier, it may be best to have a larger number of small modules 902 for every large module 901.

Alternately, it may be appropriate to have a mix of module sizes where there are 3 or more specific types, repeated at regular intervals in some ratio. Types that might be mixed together could include Multipliers, Adders, Registers, Programmable Logic Modules (LUTs or MUXs), and ALUs, for example.

Even though the logic module resources in FIG. 9 are of varying types, they are still arranged in a regular pattern. This means that automatic placement software, while still having some difficulty due to the difference in module size and function, will still benefit due to the regularity that remains.

Figure 10:
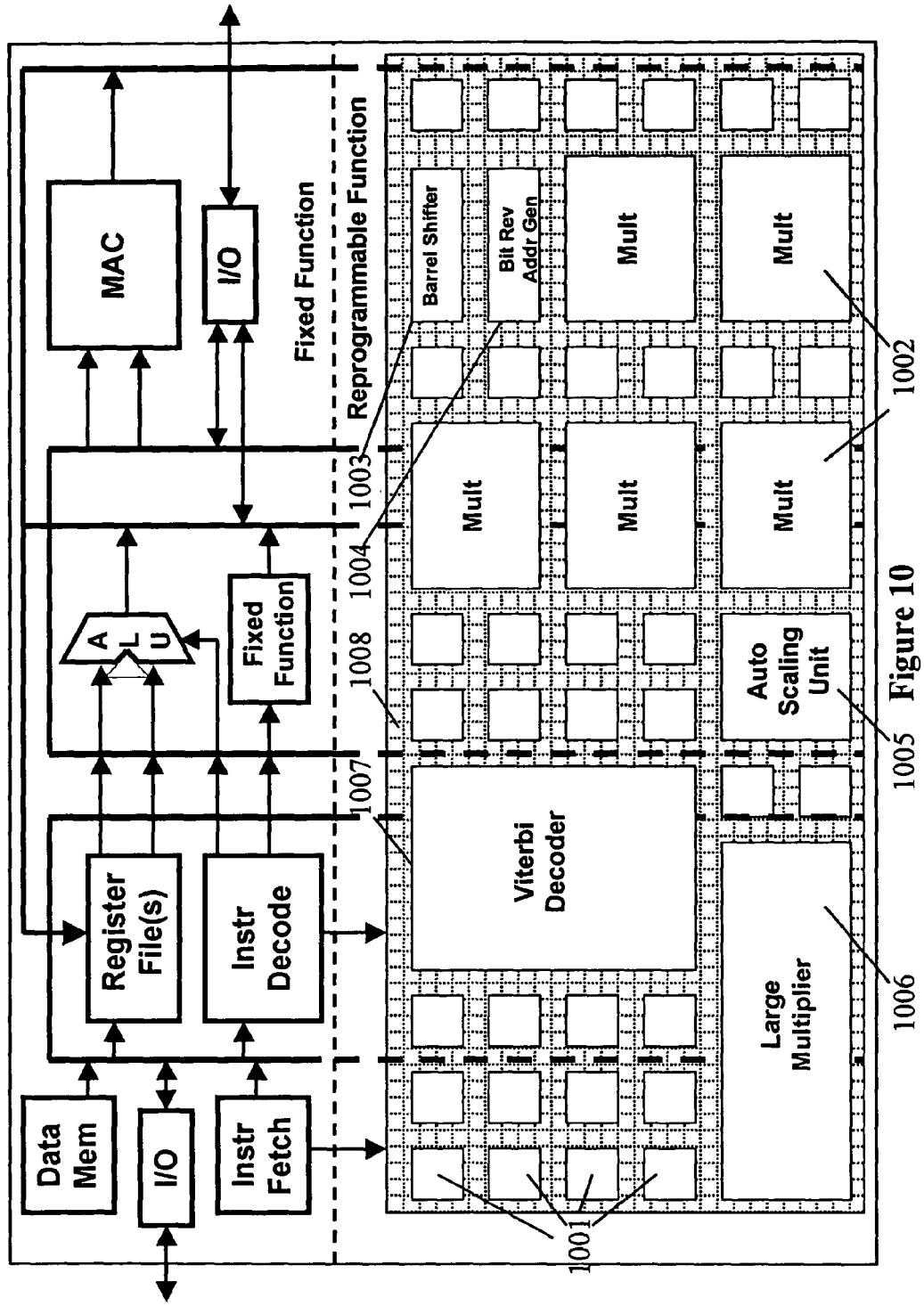
FIG. 10 shows a block diagram for DSP and where reprogrammable instructions are implemented using a heterogeneous FPGA fabric where purpose-built application-specific DSP function modules of irregular sizes are mixed together in an irregular pattern.

FIG. 10 shows a variation on a heterogeneous FPGA fabric where function blocks containing circuit types specific to DSP tasks are included, replacing some of the more general-purpose functions 1001. Modules 1001 are similar to those found in typical FPGA fabrics. The "application-specific" DSP blocks might include functions such as Multipliers 1002, Barrel Shifter 1003, Bit-Reverse Address Generator 1004, Auto-Scaling Unit 1005, Large Multiplier 1006, and Viterbi Decoder 1007.

As with FIGS. 6 through 9, function modules in FIG. 10 are connected with reprogrammable routing 1008, typically consisting of predetermined wiring structures connected together with reprogrammable switches. Even though the irregular selection of functions shown in FIG. 10 provides a significant challenge for automatic placement software, the increased speed and density made possible by such optimized functions can be more than worth the trouble. This is especially true if an instruction sequence in a real application heavily utilizes these application specific functions and, as a result, experiences a significant performance increase.

FIGS. 11a and 11b shows a cross-section of the FPGA fabrics of FIGS. 6 through 10. Diffusion patterns 1104 will normally be customized for the particular FPGA fabric shown, or in an alternate embodiment, can be constructed in a semi-custom manner. In the semi-custom approach, the particular FPGA fabric would be constructed on top of an ASIC-type fabric where a suitable array of transistor patterns are created in the diffusion layers of the device in the area where reprogrammable function is desired. The transistors in this ASIC-type fabric may all be the same, or may be a mix of different sizes and characteristics, depending on what is most suitable for constructing the FPGA fabric that will be constructed upon it. When this semi-custom approach is used, transistor patterns are diffused and the wafer is manufactured up to, but not including the point where polysilicon is applied. This difference from conventional ASICs (where wafers are prefabricated up to at least first layer metal) is due to the requirement in RAM-based FPGAs for making some short connections using polysilicon material for routing. Thus, the polysilicon layer must also have a custom pattern for each style of FPGA fabric that is constructed on the uncommitted transistor diffusion fabric.

In FIG. 11a, if a semi-custom approach is desired, the diffusion patterns for (uncommitted) ASIC transistors 1104 are created under the area where reprogrammable instruction functionality is desired. Then, an FPGA fabric, in this case a heterogeneous fabric consisting of large grain Cells 1102, small grain cells 1101, and FPGA reprogrammable routing functionality 1103 are constructed according to how the polysilicon and metalization layers are routed and connected (along with vias) in the area above the ASIC transistor diffusion patterns.

FIG. 11b shows a cross-section diagram similar to that of FIG. 11a except that the FPGA fabric is application-specific and includes functions such as multiplier 1106 and Viterbi Decoder 1107 in addition to more conventional small grain FPGA Cells 1105. Note that, if the semi-custom approach to constructing the FPGA fabric as described above is utilized, the underlying structure for the ASIC transistor diffusion patterns 1104 in FIG. 11b may be the same as that used in the structure of FIG. 11a. This ability to customize the style of FPGA fabric by configuring only the polysilicon and metalization layers in a specific area of the device provides for a relatively easy process of adapting a generic DSP with reprogrammable instructions to specific application categories. Hence, if the semi-custom approach is utilized, once the basic underlying structure has been established, different styles of device can be manufactured targeting specific application segments without having to completely redo the entire device layout. This is especially useful at geometries of 0.13 micron and smaller where the cost of mask reticles and semiconductor fabrication NRE charges have greatly increased over previous generations. Also, the relative ease with which application targeted FPGA fabrics can be created with such a methodology facilitates the ability to do this, thereby making such targeted solutions more readily available.

Figure 12:
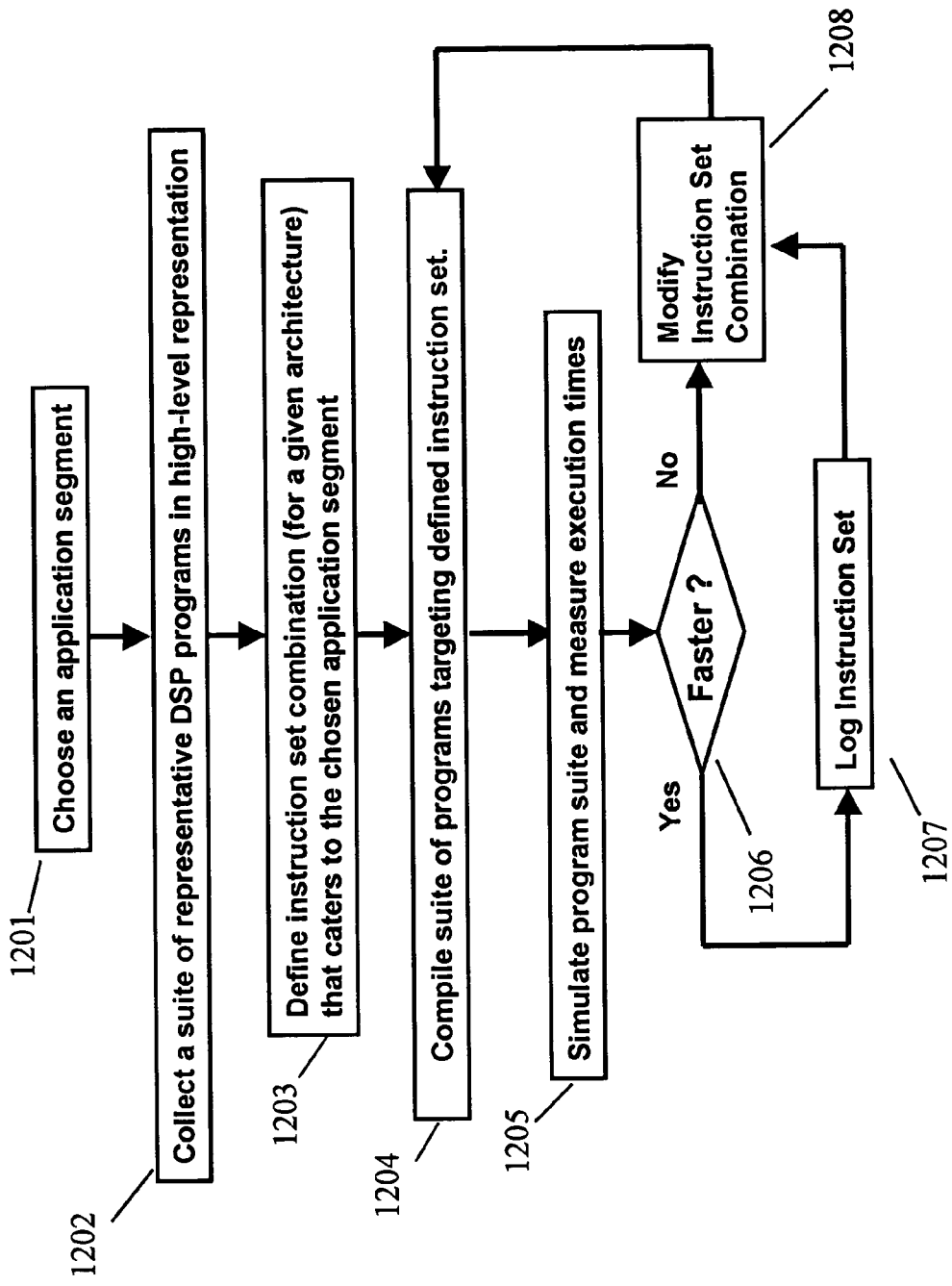
FIG. 12 shows an flow chart describing a method for determining the most suitable DSP instruction set for a particular application segment.

FIG. 12 shows a method for utilizing a reprogrammable FPGA fabric in order to construct an optimum suite of instruction set extensions for a particular user's application. Such a method could also be utilized in order to determine the best structure for the FPGA fabrics shown in FIGS. 6 through 10 in order to maximize the performance for a particular application class. The method of FIG. 12 shows an iterative process where a representative suite of DSP programs (benchmarks) are applied to different instruction set combinations programmed from a particular FPGA fabric. First an application segment is chosen in step 1201 and a suite of DSP programs representative of typical functionalities found in the target application segment are identified (step 1202). Then, in step 1203, an instruction set combination is defined that would tend to cater to the chosen application segment. The functionality of these defined instruction set combinations is made available as a model for simulation and is also supported by a software compiler. Then, in step 1204, the suite of representative programs is compiled for the defined instruction set. In step 1205, the compiled suite of programs is simulated for this variation of instruction set combinations. The execution speed of this simulation is evaluated in step 1206, and if faster than for previous instruction set combinations, this instruction set combination is logged in step 1207 to recognize it as the current choice for optimum performance. Next, a different instruction set combination is defined in step 1208, and the process continues by re-compiling the suite of programs for this new instruction set combination according to step 1204.

Figure 13:
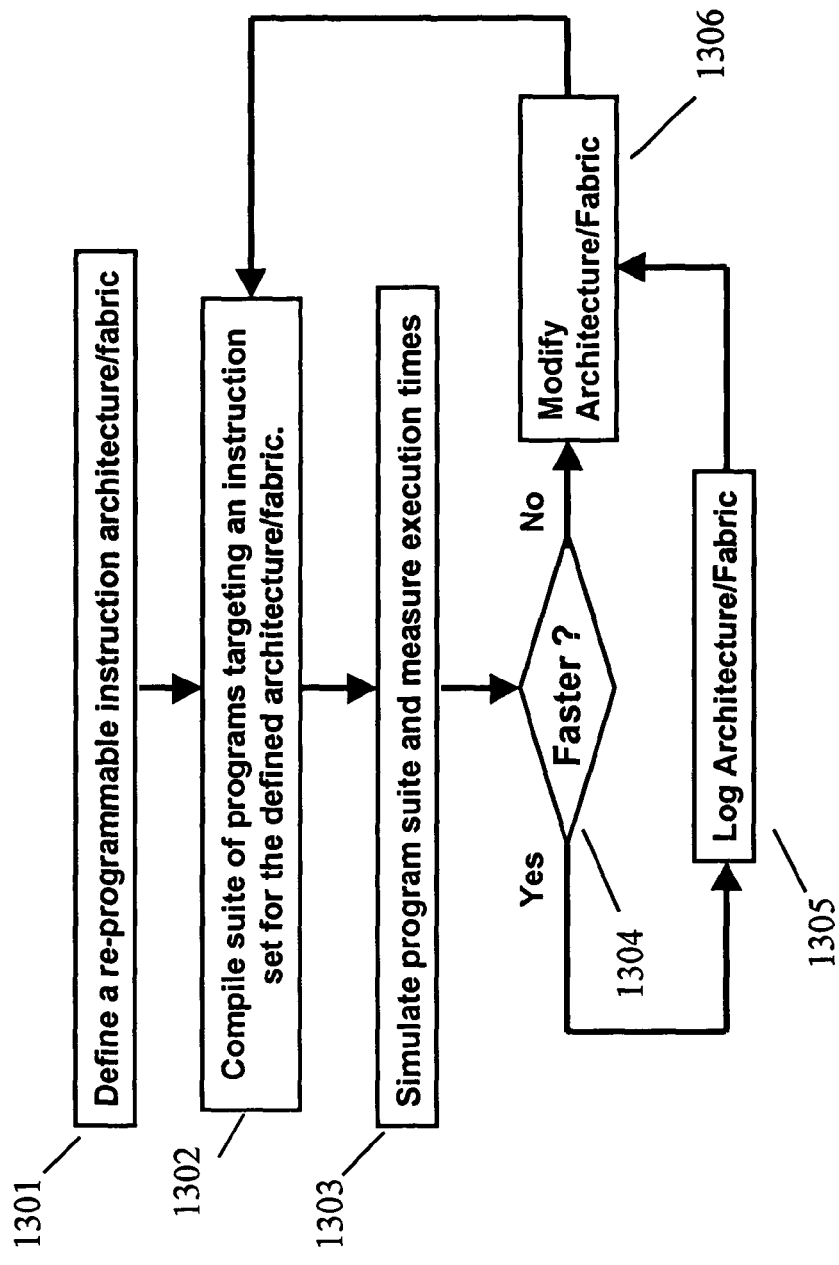
FIG. 13 shows a flow chart describing a method for determining the most suitable reprogrammable architecture and FPGA fabric to support a re-configureable DSP instruction set for a particular applications segment.

While FIG. 12 describes a method for determining an optimum instruction set for a class of applications, such an iterative method can be extended to include the determination of an optimum architecture and FPGA fabric style for a particular class of applications. FIG. 13 describes such a method, and builds upon the method of FIG. 12. In FIG. 13, the first step (1301) involves the definition of a reprogrammable instruction set FPGA architecture or fabric such as those shown in FIG. 11a or 11b. Next, a suite of representative DSP programs targeting an instruction set built on the chosen fabric are compiled (step 1302) and simulated (step 1303) in a multiple-pass iterative manner similar to that of the method of FIG. 12.

The performance of the simulated programs is logged in step 1304 and when a particular architecture/fabric produces a faster result, that fabric is logged (step 1305) as the current best performer for the targeted application segment. Next, a different architecture/fabric is defined (step 1306) and the process repeats itself until the best choice for the architecture/fabric has been determined.

Figure 14:
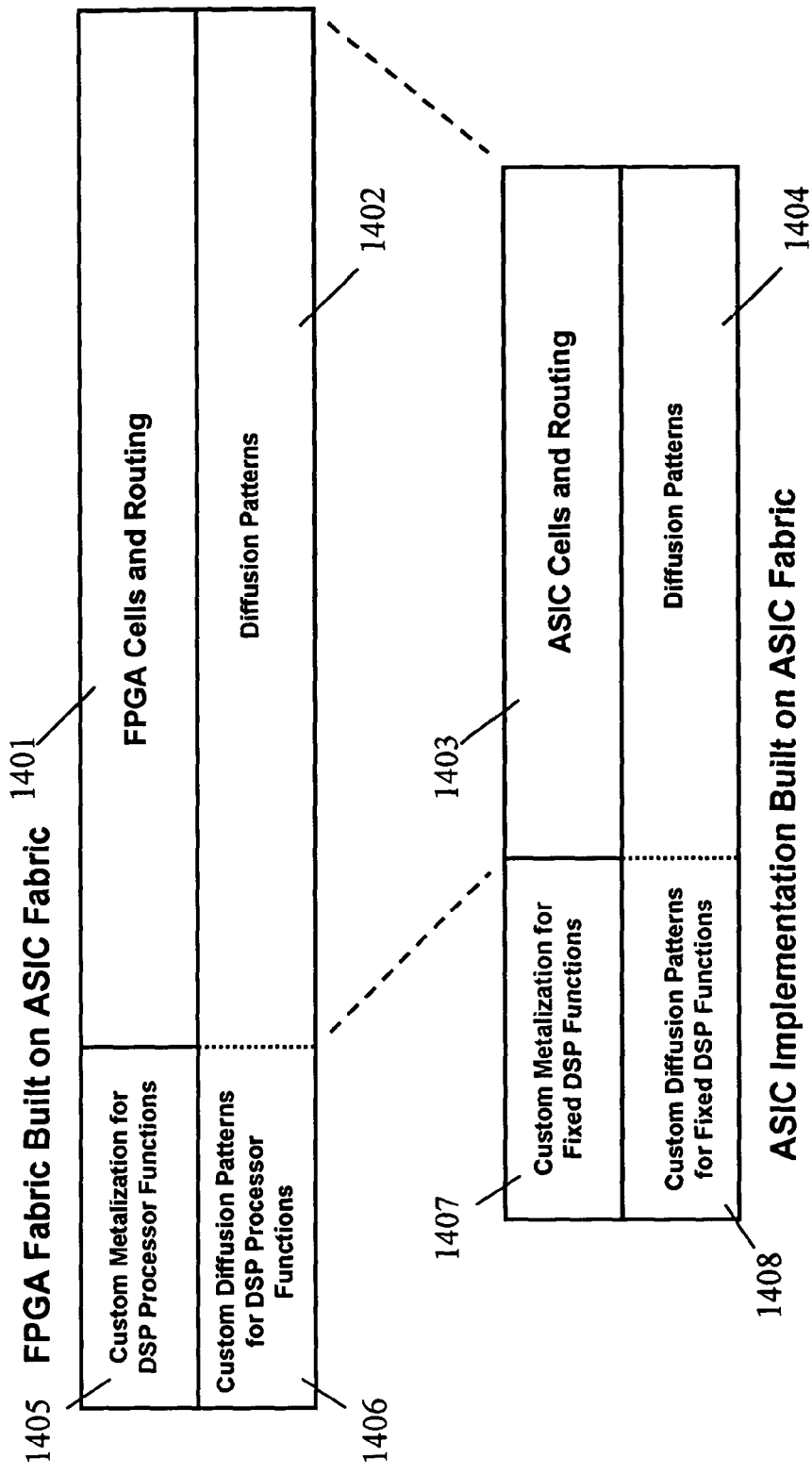
FIG. 14 shows the concept of first implementing a reprogrammable instruction DSP on a semiconductor die using an FPGA fabric, and then migrating that design to a different (smaller) die where the functionality originally implemented in the FPGA fabric is instead implemented in ASIC technology.

FIG. 14 shows the concept of first implementing a design on a semiconductor die where the custom DSP instructions are implemented in an FPGA fabric, and then migrating that design to a different (smaller) die having an ASIC base diffusion structure for the instruction fabric. A specific user design is first implemented with custom instructions built in FPGA cells and routing 1401 built on a custom diffusion structure as is the norm for FPGA construction. In an alternative embodiment of this invention, cells and routing 1401 may be constructed using a semi-custom approach as previously described for FIGS. 11a and 11b, where the reprogrammable fabric is constructed on top of an ASIC-style sea-of-transistors base diffusion structure implemented in diffusion 1402. In this alternative embodiment, to achieve a smaller die for lower cost in high volume production, this same user design may be migrated to (implemented in) a die where the custom instructions are built in a mask-configured ASIC structure 1403 built on sea-of-transistors base diffusion structure 1404. Structure 1404 is essentially identical to structure 1402 in this alternative embodiment except that the die area for 1404 is smaller than 1402. Note that metalization 1405 and diffusion patterns 1406 that implement the DSP processor functions are substantially identical to metalization 1407 and diffusion patterns 1408 respectively. In the preferred embodiment, diffusion patterns 1402 would be custom for the FPGA fabric to be implemented, and diffusion patterns 1404 would be some form of conventional ASIC base transistor array or fabric, intended to be customized with some number of custom metal masks applied for a given user application. Note that the structure for the ASIC fabric implemented with diffusion 1404 and ASIC cells and routing may take a number of forms. ASIC fabric 1404 may contain uncommitted transistors requiring all metal layers to be customized for a given user design or some of the metal layer in ASIC cells and routing 1403 may be pre-configured such that standard modules are pre-formed, these modules being further connected with custom metal routing in the final layers to configure the device for a particular user application.

Figure 15:
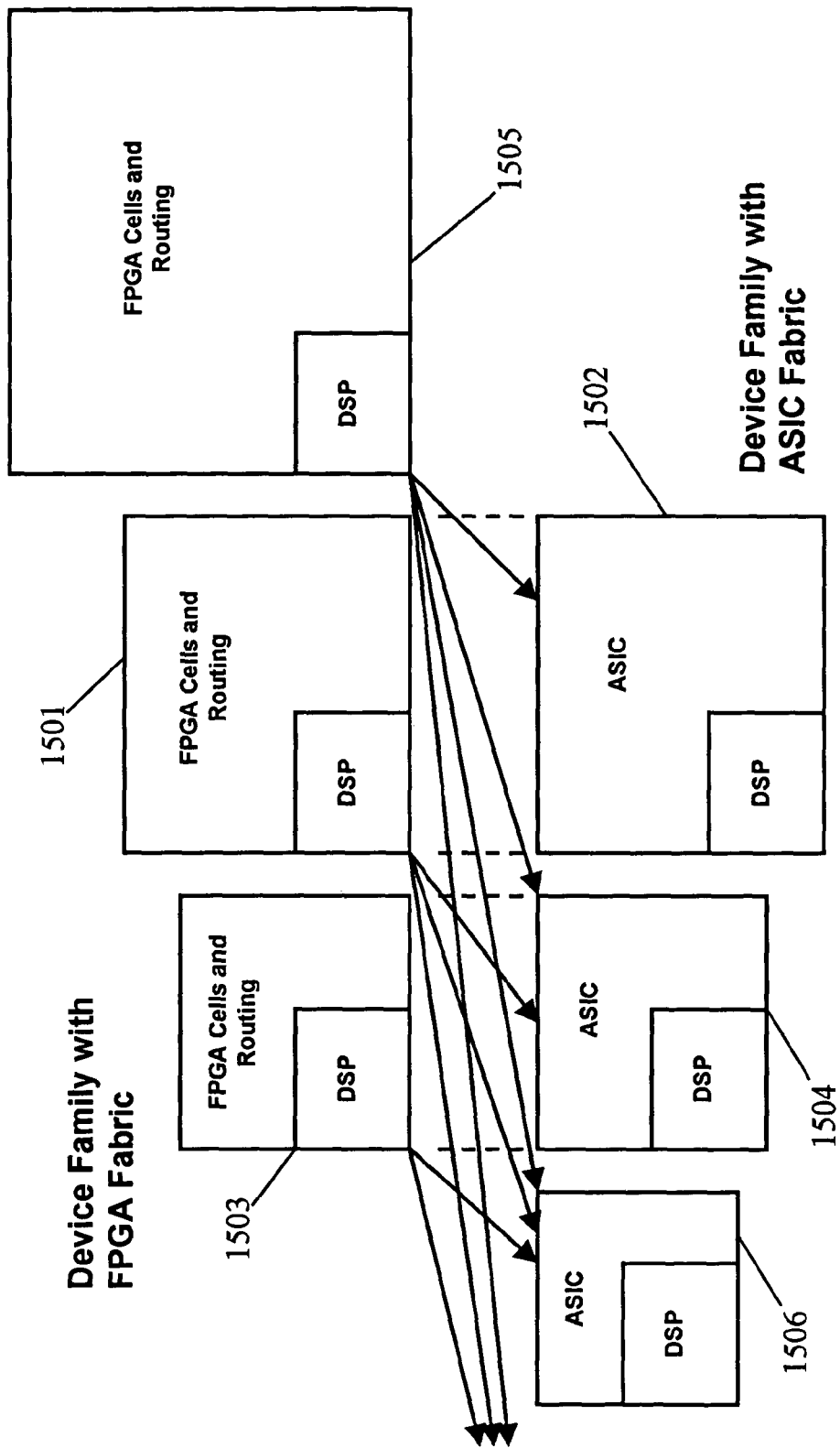
FIG. 15 demonstrates a method where a family of reprogrammable instruction DSP devices includes FPGA-based designs that can be migrated to a family of similar devices where the functionality originally implemented in the FPGA fabric of the reprogrammable instruction devices is instead implemented in ASIC technology.

FIG. 15 shows a family of Reprogrammable Instruction DSPs (1501, 1503, and 1505) and a family of Similar DSPs with hard-wired instruction fabric (1502, 1504, and 1506). Across both families, the DSP functionality is the same and all devices, whether possessing reprogrammable or hard-wired instruction fabric, have the same I/Os, RAM, and other supporting functions as will be demonstrated in FIG. 16. The arrows in FIG. 15 indicate that the functionality of any member of the reprogrammable device family can be migrated to a member of the hard-wired device family, thereby reducing the overall die size of the device. A unique design flow (method) for using both families will be demonstrated in FIG. 17.

In an alternative embodiment, FIG. 15 can be used to demonstrate how a single family of base die can be used to build a family of DSP devices with reprogrammable FPGA-style instruction extension functionality and a family of DSP devices with mask-configured ASIC-style instruction extension functionality. Note that, for this alternative embodiment, the base die (diffusion) pattern for device 1501 is identical to that of device 1502. Here, the diffusion fabrics are constructed with a semi-custom approach for both the FPGA fabric of 1501 and the ASIC fabric of 1502, as described earlier with regard to alternative embodiments for FIGS. 11 and 14. In other words, the same base (partially-fabricated) wafers can be used to build both 1501 and 1502. In a similar way, the base die (diffusion) pattern for device 1503 can be identical to device 1504. When taking advantage of this alternative method, user designs that are prototyped in (or enter production) in a device with FPGA-style functionality, can be migrated to a smaller die by implementing the custom instructions in ASIC-style functionality. Thus, a design implemented in device 1505 may be migrated to device 1502, 1504, or 1506, or an even smaller die, depending on the particular design and the required amount of custom functionality. It should be noted that the concept described for the alternative embodiment for FIG. 15 where a single family of base wafers is utilized to implement families of both FPGA-style and ASIC-style function is unique in the industry. Also unique is using the ASIC-style family for volume production cost reduction for designs initially implemented in the FPGA-style family, where both families are built on a common family of base-wafers.

Figure 16:
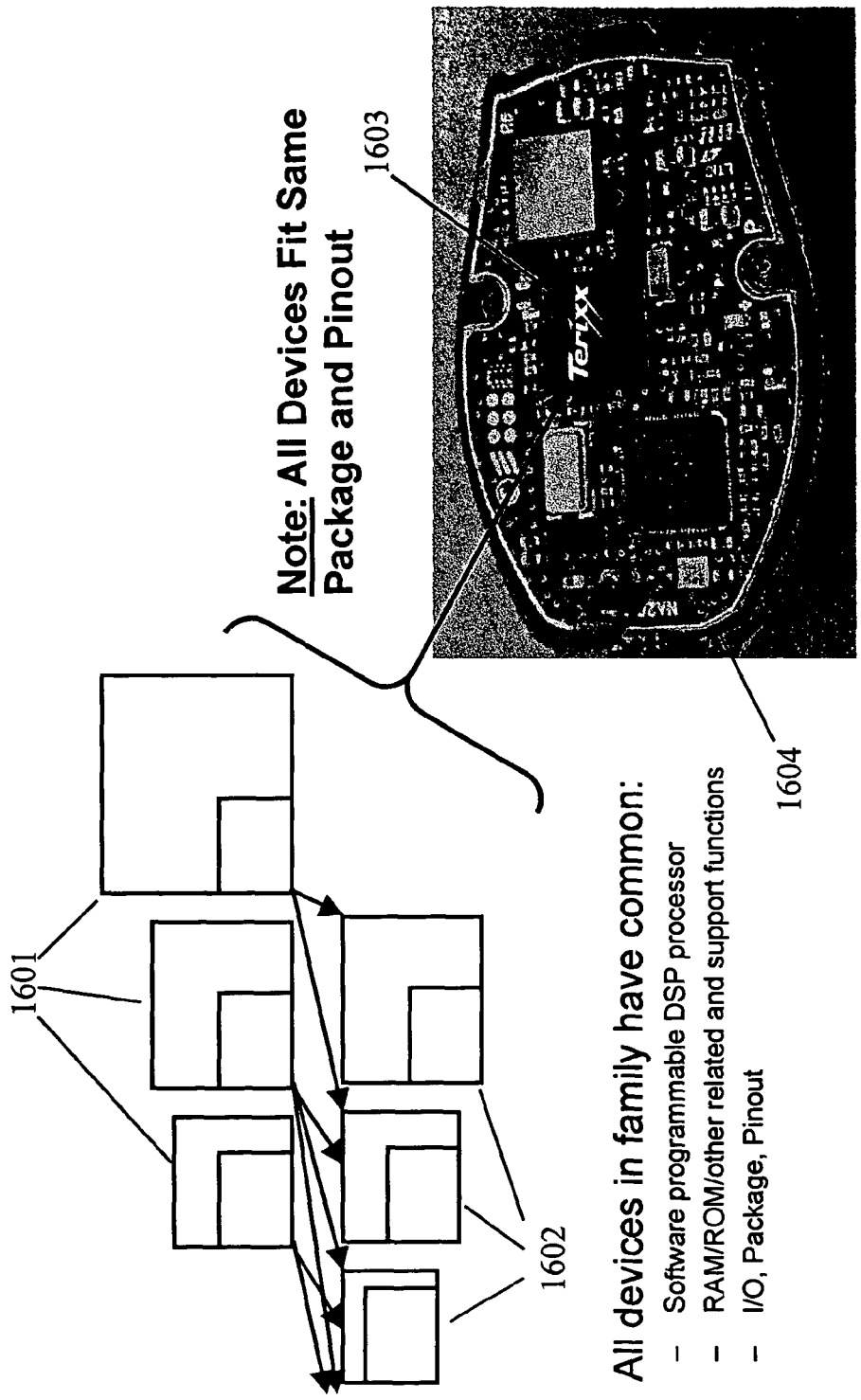
FIG. 16 further demonstrates that all devices within the families shown, whether FPGA-based or ASIC-based, have identical DSP and I/O functionality, and can therefore operate in the same socket in the same application.

FIG. 16 emphasizes how families of rDSP devices and their hard-wired counterparts can be constructed such that all devices within both groups can plug into the same socket 1603 in the user's product 1604 and perform the same function. Actually, the larger devices will be able to fit more software functionality in their FPGA/ASIC fabric and therefore have higher performance—but with the same function. Alternately, the devices containing larger amounts of FPGA/ASIC fabric may operate at a reduced clock rate to achieve lower power, instead of operating at a higher clock rate.

All devices shown in FIG. 16, whether having reprogrammable fabric 1601 or hard-wired ASIC fabric 1602, contain identical conventional DSP functionality including supporting functions like timers, RAM, ROM, and PLLs. All devices in both reprogrammable and hard-wired families also have identical I/O functionality, and are therefore capable of plugging into the same socket 1603 in user system 1604.

Figure 17:
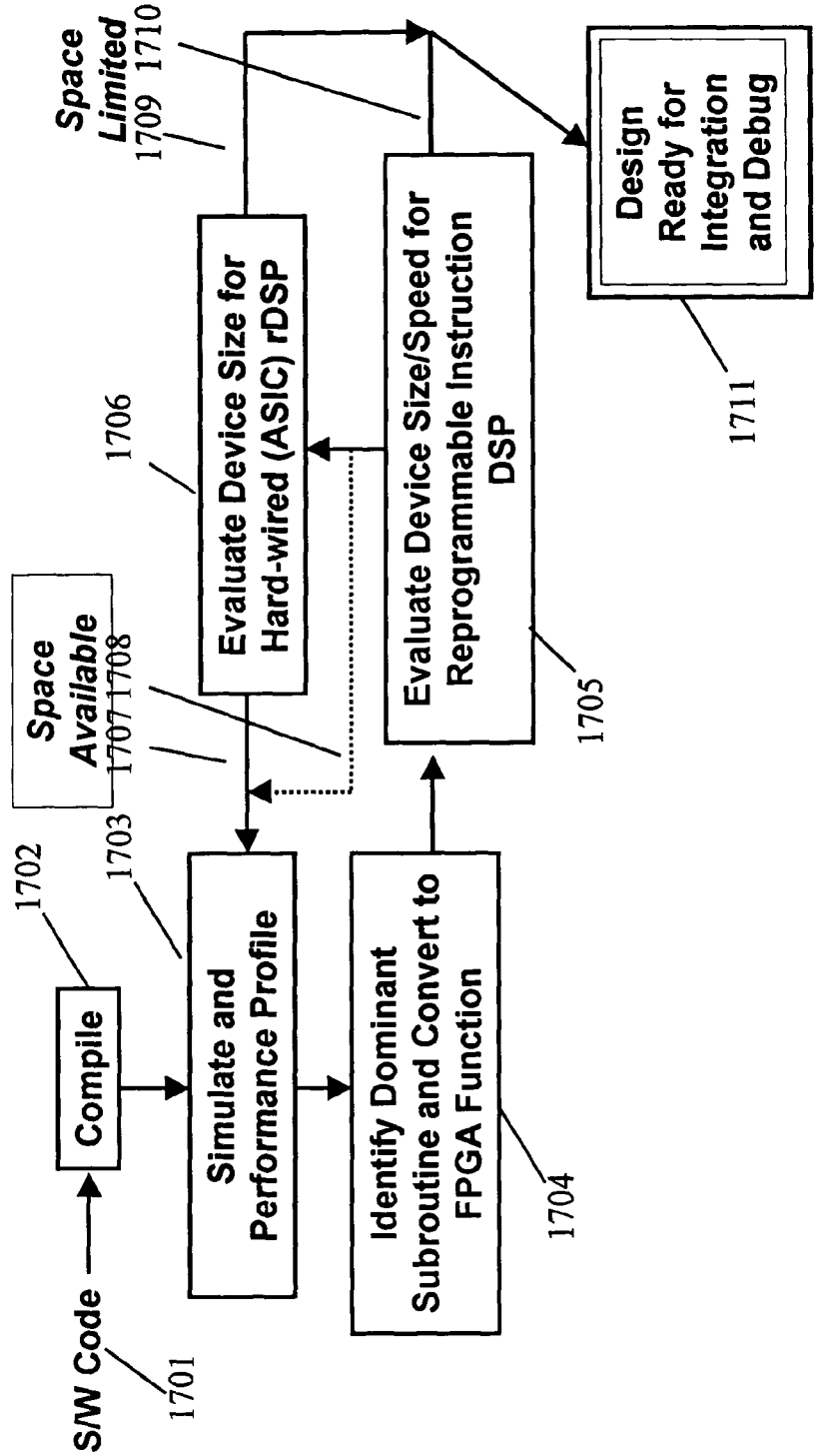
FIG. 17 shows a flow chart for the development process using the device families of FIGS. 15 and 16, where the initial development process for the reprogrammable instruction DSP includes a provision for evaluating which of the ASIC-based family members is capable of implementing the reprogrammable instruction functionality when it is later hard-wired, the result being a more cost-effective solution for volume production.

FIG. 17 shows the design flow for a Reprogrammable Instruction DSP (rDSP) performed with awareness of the hard-wired ASIC version. This flow is significant because it is often the case that the cost of the ASIC version in volume production is the most critical factor to be considered once the performance goal has been met. Therefore, in isolating and moving software subroutines into FPGA functionality, the flow will also include an estimation of whether the currently defined functionality will fit in the hard-wired ASIC counterpart. First, software code 1701 is compiled 1702 and then goes to a process of simulation and performance profiling 1703. Then, as a result of profiling and determining which subroutines are dominating the processor's execution time, that subroutine which consumes the largest percentage of processor run time is isolated and converted 1704 to FPGA functionality for implementation in the reprogrammable function area of the rDSP.

Next, the overall performance of the rDSP, including the software-programmable conventional DSP function combined with the reprogrammable FPGA function is evaluated 1705. Simultaneously, evaluation step 1705 also includes a comparison of the size required for the reprogrammable function relative to the reprogrammable area available in the various members of the rDSP family. If there is significant space still available in the family member that currently can contain the FPGA functionality defined so far, the process will continue, and optionally be further evaluated in step 1706 to see if the defined hardware functionality will fit in the chosen hard-wired ASIC version. In fact, step 1706 may be significantly more important than step 1705 regarding device size for a company that is only concerned about volume production prices and not at all concerned about device cost during the initial production stage. In this regard, a variation on the flow shown in FIG. 17 would not include step 1705 and only include step 1706 for the purposes of evaluation.

If additional space is available in either the reprogrammable version 1708 or in the hard-wired version 1707, or both, simulation and performance profiling 1703 will be performed again, followed by subroutine identification and conversion 1704, and then further size and speed evaluation 1705 and/or 1706. Finally, when the performance requirement has been met, and/or the current member of the rDSP family containing the FPGA functionality has limited space 1710 to add additional functionality, and/or the hard-wired version has limited space 1709 to add additional functionality (the choice here depending on the focus of the user company), the overall rDSP design is declared ready for implementation, integration, and debug 1711. If the performance has not met the desired goal, the cycle can continue with the "space available" comparison steps 1707 and 1708 being performed relative to a larger rDSP family member (reprogrammable instruction and/or hard-wired instruction version).

Figure 18:
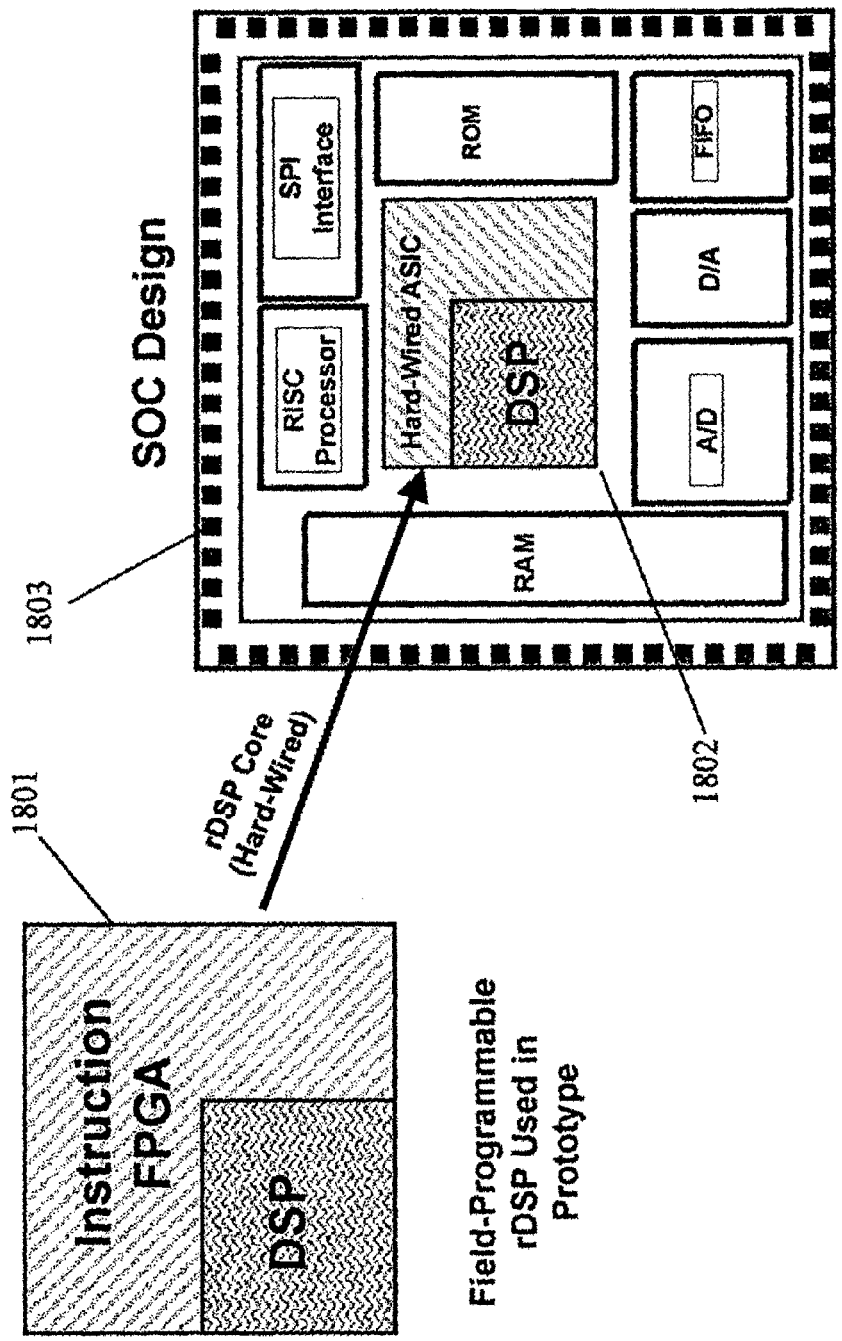
FIG. 18 shows a method for prototyping a design intended for a SOC device using a reprogrammable instruction DSP, where for the volume production SOC device, the hard-wire version of the reprogrammable instruction is used.

Another method comes into play when the user company is building an SOC (System On Chip) device that needs DSP functionality. Here the rDSP with reprogrammable instruction fabric 1801 is utilized to aid in speeding the development flow while, at the same time, not compromising the cost for the volume production SOC. This is accomplished as shown in FIG. 18 by utilizing the discrete rDSP device 1801 with reprogrammable FPGA instruction fabric for board-level prototyping and emulation, and them providing the same functionality in the SOC 1803 by embedding an IP core version of the rDSP function 1802 where the instruction fabric is implemented with hard-wired ASIC.

Figure 19:
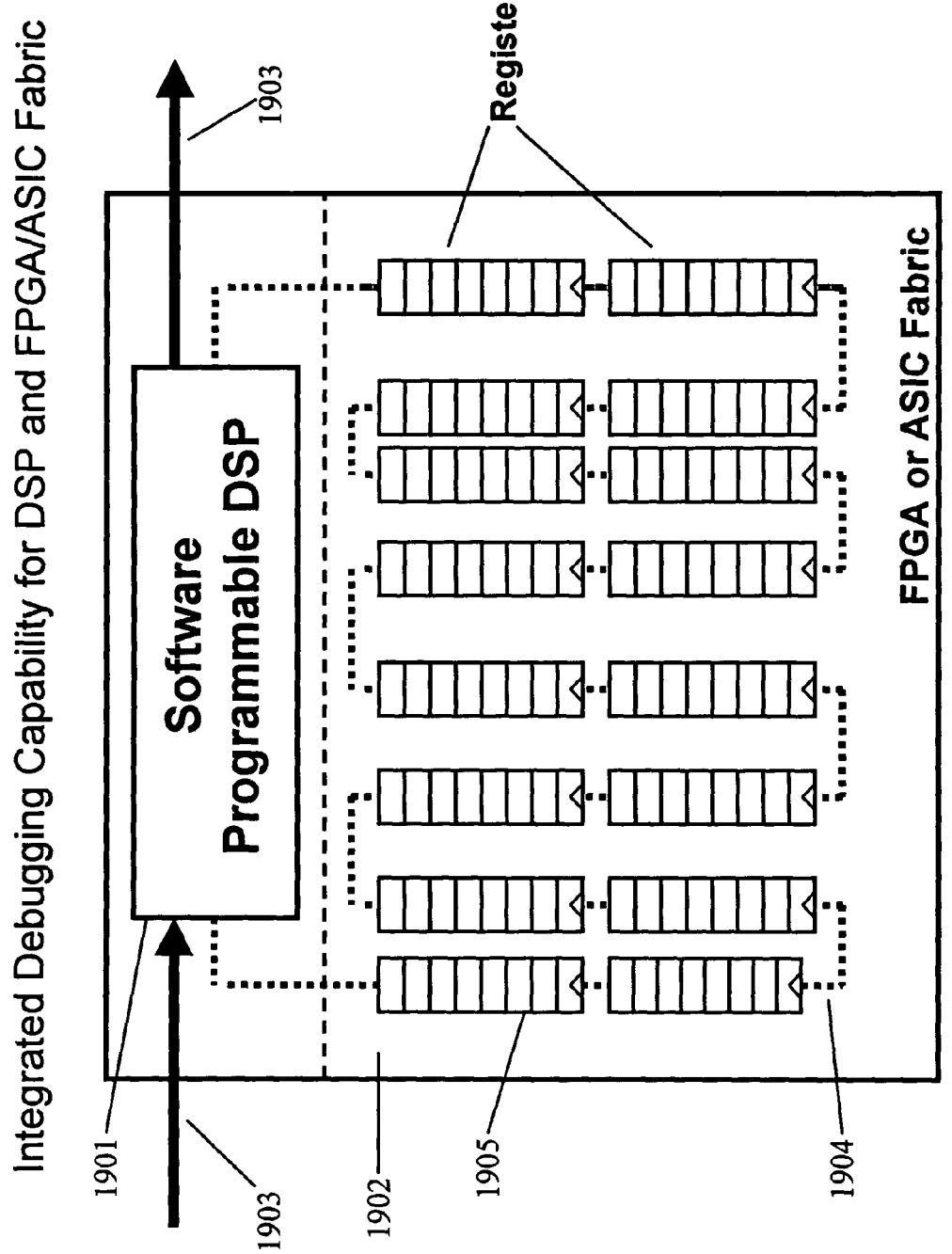
FIG. 19 describes the functionality for a Reprogrammable Instruction DSP where the registers in the arithmetic (FPGA or ASIC) fabric are made read/write accessible from the perspective of the integral software-programmable DSP, enabling the software debugging program to transparently include hardware debug for the arithmetic fabric.

When FPGA devices are married to separate DSP devices, the FPGA must be debugged by a hardware designer while the DSP is debugged by the software engineer using a software debugger program. This greatly complicates the debug process. Debugging FPGAs has been improved by embedding "logic analyzer" functionalities that are synthesized into specific user designs. Although useful for a hardware designer, this methodology is not integrated with the normal DSP software debugger and required much hardware expertise to use. An alternative methodology is used in the rDSP architecture as shown in FIG. 19. This takes advantage of the fact that the DSP processor and arithmetic fabric (FPGA or ASIC) are intimately tied together in the rDSP architecture and the fact that for rDSPs, the software execution flow is maintained in spite of some subroutines effectively being executed in the arithmetic fabric. Since for rDSPs, there is never simultaneous co-processing of software instructions and hardware algorithms, the execution paradigm remains consistent with normal software execution and enables an integrated debugging environment to be implemented that, to the software engineer, makes all execution during debug—including the arithmetic fabric—look like normal software execution.

FIG. 19 shows an rDSP relative to the data path used to access data from the arithmetic (FPGA or ASIC) fabric 1902 during debug. During the execution of a specific DSP algorithm in the arithmetic fabric, data is typically clocked into registers 1905 at various stages of the algorithm execution. Consistent with the rDSP architecture, software programmable DSP processor 1901 controls the access to primary I/Os 1903. The usual software debugging program would run on processor 1901, and typically has the ability to trap on preset conditions and dump and restore the contents of registers and memory in the DSP. In the rDSP, when the execution flow reaches an instruction or subroutine that is executed in arithmetic hardware fabric 1902, the debugger program will also have access to the contents of any registers or memory within fabric 1902 by way of access mechanism 1904 which, for example is shown here as a scan chain. Access of registers may be accomplished by a number of (or some combination of) known serial or parallel mechanisms, which should, however, preferably be the same for both the FPGA and ASIC implementations to allow the software debugging program to be the same for each.

By constructing the rDSP architecture as shown in FIG. 19, the hardware functionality in the FPGA or ASIC fabric can be debugged as part of the normal debugging procedure—the software debugger user interface being substantially unchanged from the normal software debugger paradigm.

Given the fact that the DSP processor 1901 is in full control of arithmetic fabric 1902, it not only enables integrated debugging, but also enables the processor to apply test patterns to the arithmetic fabric during manufacturing test of the fabric. This not only simplifies the hardware design relative to test issues, but also speeds up test times. By utilizing processor 1901 to apply test patterns to the arithmetic fabric, the device can essentially "self-test", without having to apply the large amount of test patterns that are normally required for ASIC testing.

To construct an rDSP as described thus far in this specification, it required that an FPGA fabric be available to be integrated on the rDSP integrated circuit. To obtain this FPGA fabric, one must either license a fabric from an IP supplier or existing FPGA manufacturer, or alternately, create a new FPGA fabric. Yet another alternative is to include existing FPGA devices in an rDSP solution by combining two die or semiconductor devices in a multi-chip "System-in-Package" type solution that can emulate a high volume ASIC device.

Figure 20:
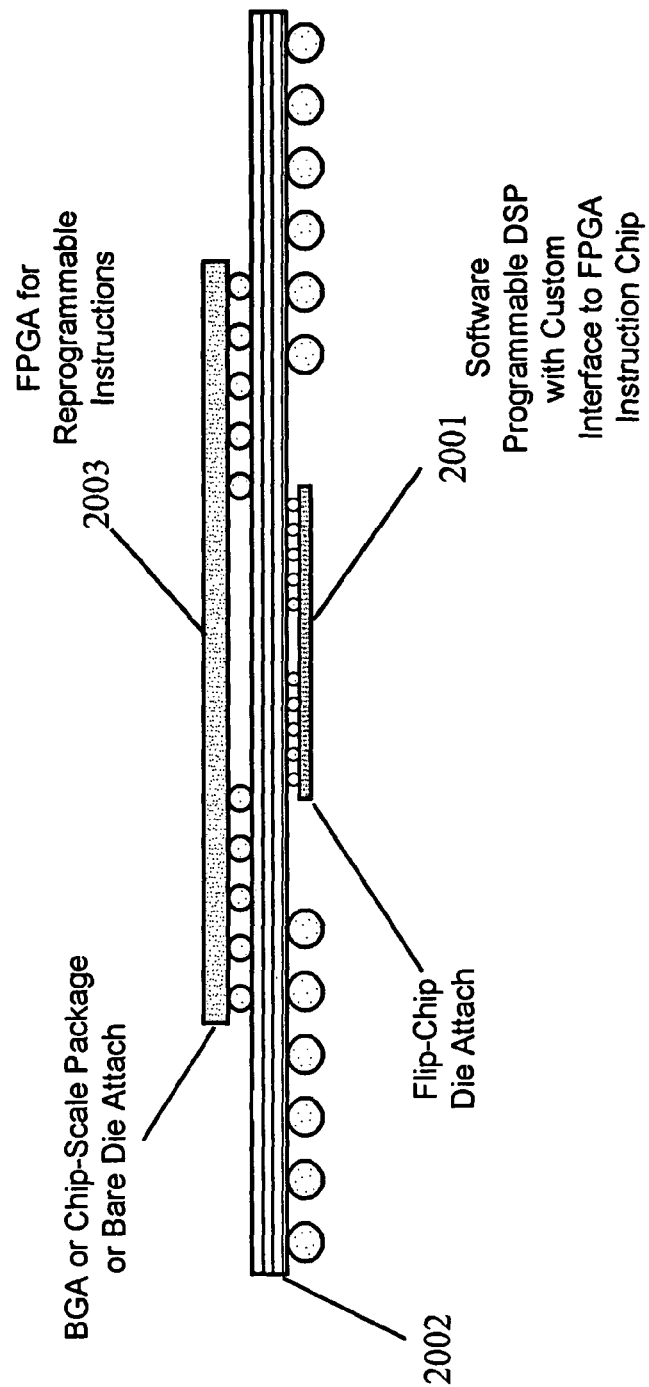
FIG. 20 shows an SIP solution where a die containing a software programmable DSP is combined in the same package with a conventional FPGA device.

To serve prototype and initial production requirements, a System-in-Package (SIP) solution is described in FIG. 20 where a custom device or die 2001 containing a DSP processor with programmable instruction interface is mounted in the same package 2002 as a conventional FPGA device 2003, where FPGA device 2003 implements custom instructions for algorithm acceleration in support of the DSP. SIP package 2002 may be fabricated using the same high-density, multi-layer laminate technology that is normally used for constructing multi-layer flip-chip BGA packages. DSP die 2001 may be either flip-chip or wire-bond attached, and is most probably a bare die. FPGA device 2003 may be a bare die, or alternately a packaged die in either a conventional package or a miniature chip-scale package.

FPGA device 2003 may be attached to package 2002 after DSP 2001 has been attached. In fact, the package assembly shown in FIG. 20 may be delivered to a customer's PCB assembly house without FPGA 2003, where FPGA device 2003 may then be attached to package 2002 either before or after package 2002 has been attached to the customer's product PCB. Note that custom device or die 2001 containing the DSP could be implemented in any custom or semi-custom ASIC technology, and that in addition to (or instead of) including the programmable DSP, other fixed functions could be used in a similar emulation scenario. To be consistent with this invention as described, the I/O connections to leaving package 2002 would connect primarily to custom device 2001, while the connections from FPGA 2003 connect primarily to custom device 2001.

Figure 21:
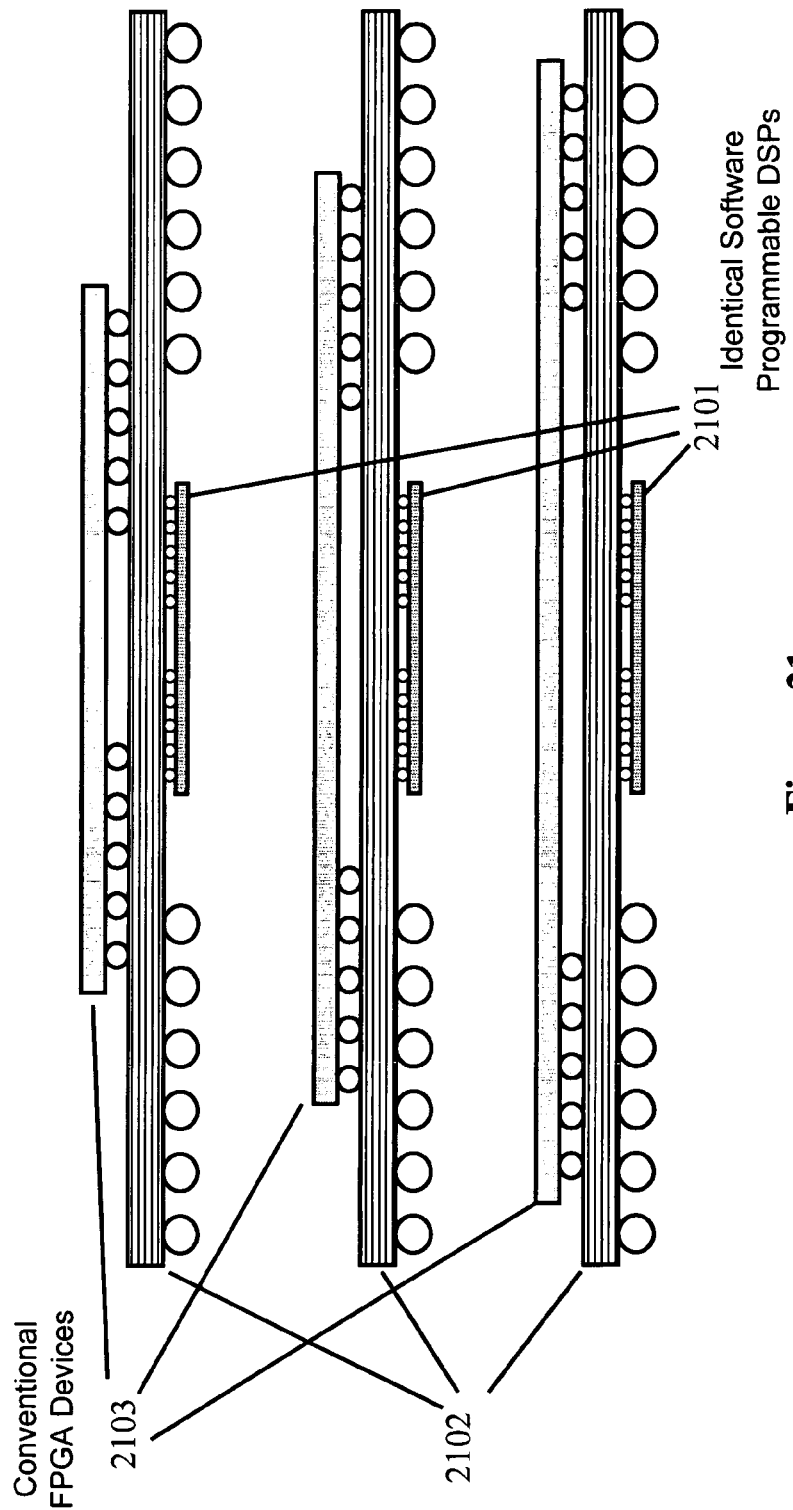
FIG. 21 shows a family of SIP solutions, consistent with FIG. 20, where different sizes of conventional FPGA device are utilized for different family members, and the same DSP device is used for all family members.

A family of rDSP SIP devices based on the design of FIG. 20 is shown in FIG. 21. Here, all DSP devices 2101 are identical, but the size of FPGA devices 2103 varies across the family. Package substrates 2102 will have different layout and routing patterns across the family in order to accommodate the different sizes of FPGA device 2103.

Figure 22:
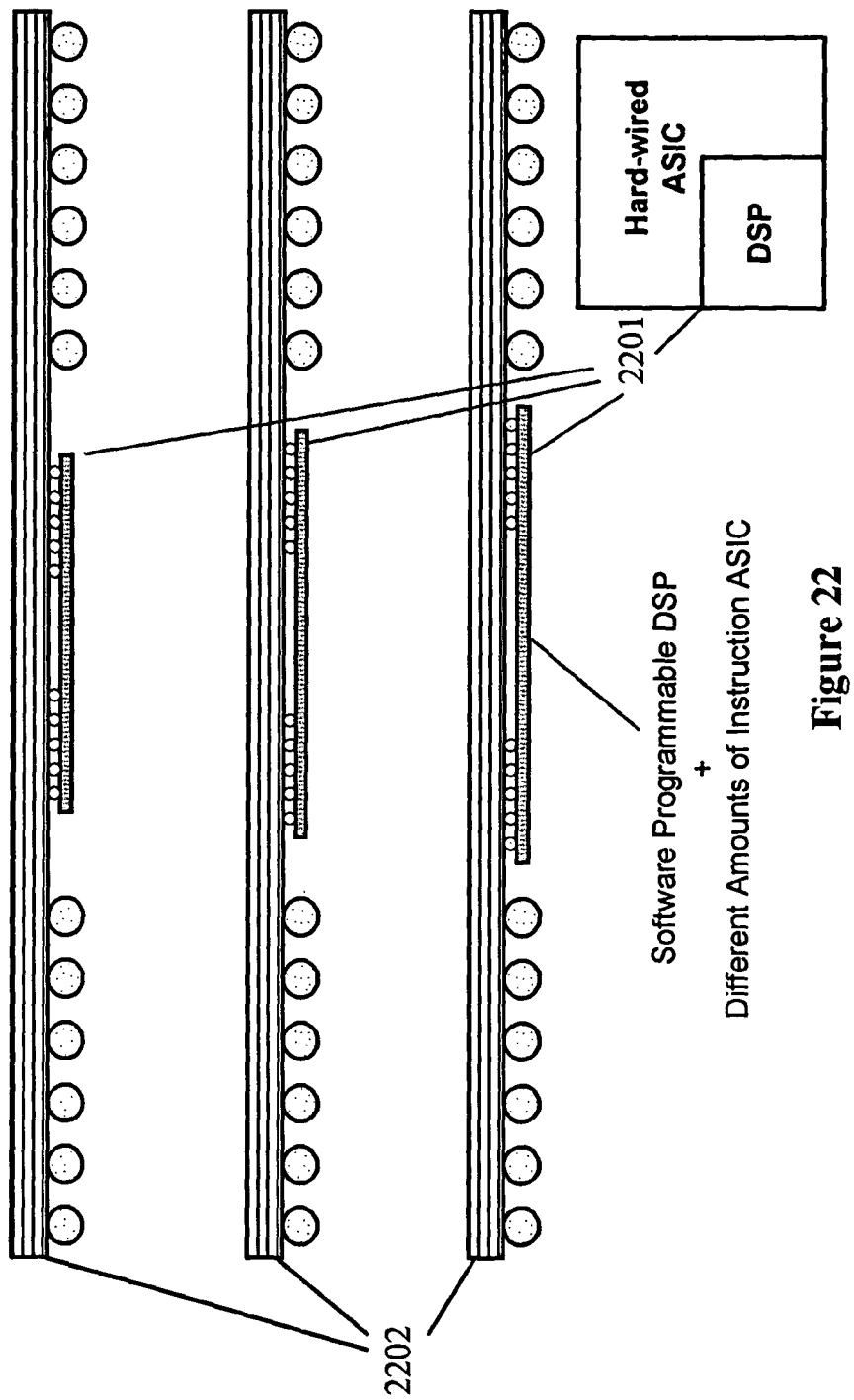
FIG. 22 shows a family of Programmable DSP devices containing a single die based on an ASIC arithmetic fabric, and intended for volume production of designs initially implemented in the device family of FIG. 21.

A family of fully integrated, single die solutions with ASIC arithmetic fabric is shown in FIG. 22, suitable for migration of designs to higher volume production. Here, all die 2201 include the software programmable DSP and all related functionality as contained in die 2101 of FIG. 21. Also, die 2201 contain differing amounts of ASIC arithmetic fabric in order to implement the differing amounts of accelerated instruction logic contained in FPGA devices 2103 of FIG. 21. Package substrates 2202 will each be custom in order to properly mount the different sizes of die 2201. Although die 2201 will all contain the same I/O signals, their differing die sizes and need for different mounting patterns on substrates 2102 are due to the larger number of power and ground pads that are required on the larger die in the family.

Figure 23:
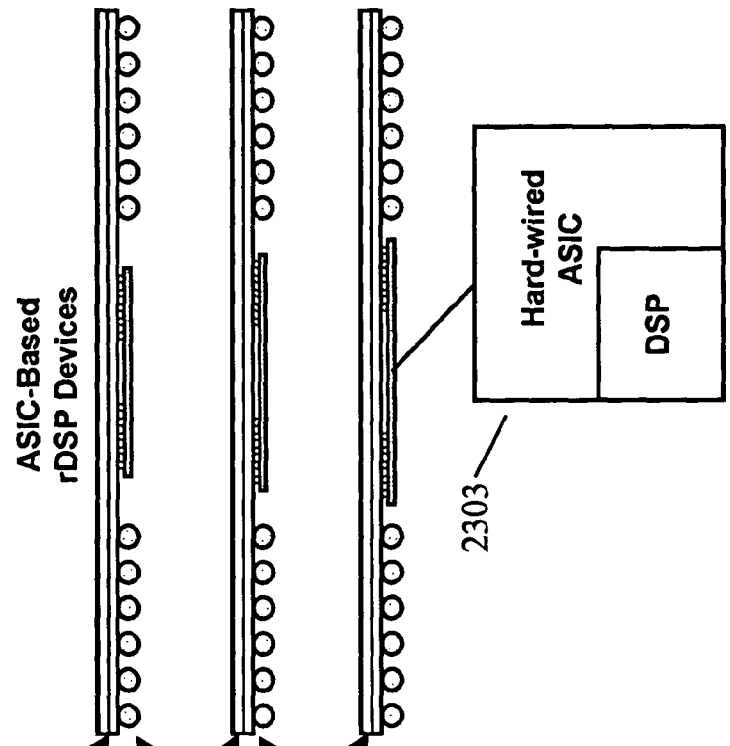
FIG. 23 shows how members of the device family shown in FIG. 21 may be migrated to members of the device family shown in FIG. 22.
Figure 23:
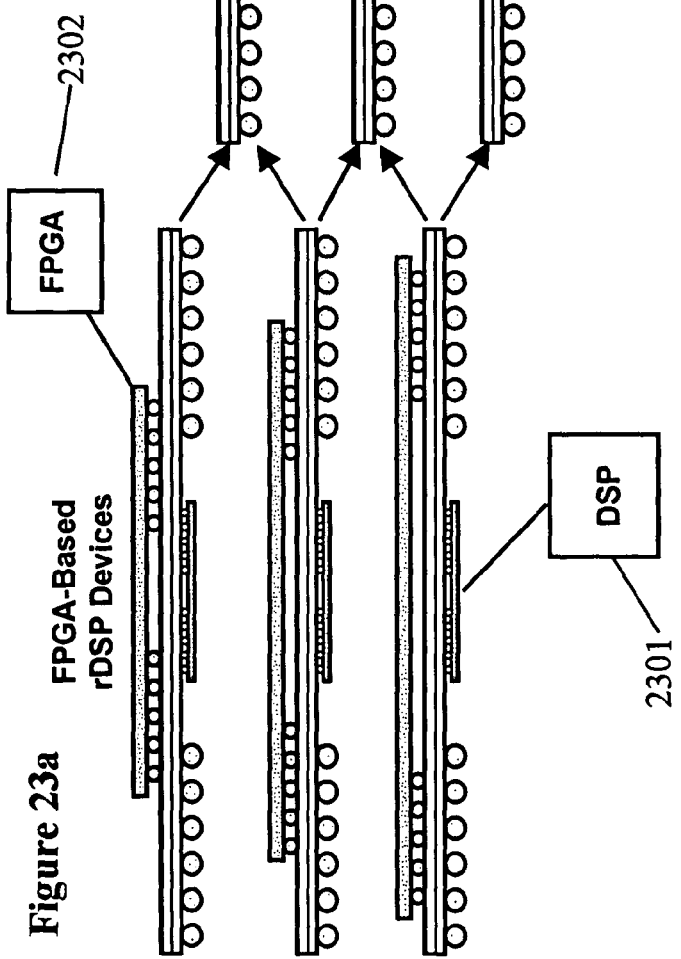

FIG. 23 shows how members of the device family shown in FIG. 21 may be migrated to members of the device family shown in FIG. 22. During the migration of a particular design originally implemented in an FPGA-based SIP solution, DSP functionality 2301 and functionality contained in discrete FPGA device 2302, will be combined into device 2303 which contains both the required DSP and related functionality as well as the arithmetic logic fabric required to implement all accelerated instructions originally implemented in discrete FPGA 2302. Which family member of FIG. 22 (ASIC-based rDSP devices) will be chosen to implement a particular user design first implemented in a family member of FIG. 21 (FPGA-based rDSP devices) will depend on the specific application, and how the logic representing accelerated instructions fits in the available arithmetic fabric within the various available ASIC-based rDSP devices 2303. Note that for devices shown in FIGS. 22 and 23 that contain some form of ASIC arithmetic instruction fabric, this ASIC fabric may be custom or semi-custom, and be implemented using any of a variety of known ASIC technologies with different amounts of prefabrication having been performed for some or most of the semiconductor fabrication process steps prior to customization for a particular design using custom masks for the remaining fabrication process steps.

Also note that custom (or semicustom) device 2303 includes the fixed functions implemented in device 2301. In fact, if devices 2301 and 2303 are constructed using semi-custom ASIC devices with pre-defined base wafers, the base wafers used for implementing devices 2301 and 2303 could be identical. In the case of device 2301, connections that interface with new logic functionality (such as configurable instruction logic for a programmable instruction DSP) can be brought out and connected to FPGA 2302—a portion of the ASIC logic in device 2301 going unused. The same ASIC base wafer can then be used for device 2303 where the functionality previously implemented in FPGA 2302 is instead implemented in the ASIC logic fabric within device 2303.

Therefore, methods and apparatus for implementing an Emulation Solution for a Programmable Instruction DSP, have been described.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A family of integrated circuit packages, said family comprising a plurality of integrated circuit packages, wherein each of said packages includes provision for attaching a single fixed-function custom device and a single field-programmable gate array device; and
   wherein each package of said packages has I/O connections leaving the package; and
   wherein said I/O connections leaving an integrated circuit package within said family come primarily from said fixed function custom device, said I/O connections being compatible in terms of I/O functionality and footprint for all integrated circuit packages in said family; and
   wherein each of said field programmable gate array devices has a different logic capacity for each member of said family.

2. The family of integrated circuit packages of claim 1 where said field-programmable gate array device is a packaged device.

3. The family of integrated circuit packages of claim 1 where for each integrated circuit package in said family, said field programmable gate array device is mounted on the top side of said integrated circuit package and said fixed function custom device is mounted on the bottom side.

4. The family of integrated circuit packages of claim 1 where for each integrated circuit package in said family, said fixed function custom device is identical to that on each of the other packages in the family.

5. The family of integrated circuit packages of claim 1 where said fixed function custom device contains a software-programmable processor.

6. The family of integrated circuit packages of claim 5 where said software-programmable processor also includes a configurable instruction interface to connect with instruction logic implemented in configurable logic.

7. A family of integrated circuit packages, said family comprising a plurality of integrated circuit packages, wherein each of said packages includes provision for attaching a single fixed-function device and a single field-programmable gate array device, and
   wherein each package of said packages has I/O connections leaving the package; and
   wherein said I/O connections leaving an integrated circuit package within said family come primarily from said fixed function device, said I/O connections being compatible in terms of I/O functionality and footprint for all integrated circuit packages in said family; and
   wherein said field programmable gate array device has a different logic capacity for each member of said family; and
   wherein said fixed function device contains a software-programmable processor with a configurable instruction interface, said configurable instruction interface connecting with instruction logic implemented in configurable logic contained within said field-programmable gate array device.

8. The family of integrated circuit packages of claim 7 wherein for each integrated circuit package in said family, said field programmable gate array device is mounted on the topside of said integrated circuit package and said fixed function device is mounted on the bottom side.

9. The family of integrated circuit packages of claim 8 wherein said field programmable gate array device is a packaged device.

10. A family of integrated circuit packages, said family comprising a plurality of integrated circuit packages, wherein each of said packages includes provision for attaching a single fixed-function device and a single field-programmable gate array device; and
    wherein for each integrated circuit package in said family, said field programmable gate array device is mounted on the topside of said package and said fixed function device is mounted on the bottom side; and
    wherein said fixed function device includes a software-programmable processor; and
    wherein for each integrated circuit package in said family, said field programmable gate array device has a different logic capacity.

11. The family of integrated circuit packages of claim 10 wherein said field programmable gate array device is a packaged device.

12. A family of integrated circuit packages, said family comprising a plurality of integrated circuit packages, wherein each of said packages includes provision for attaching a single fixed-function device and a single field-programmable gate array device; and wherein each package of said packages has I/O connections leaving the package; and wherein said I/O connections leaving an integrated circuit package come primarily from said fixed function device, said I/O connections being compatible in terms of I/O functionality and footprint for all integrated circuit packages in said family; and wherein said field programmable gate array device has a different logic capacity for each member of said family; and wherein for each integrated circuit package in said family, said field programmable gate array device is mounted on the top side of said integrated circuit package and said fixed function prototype device is mounted on the bottom side.

13. A family of integrated circuit packages, said family comprising a plurality of integrated circuit packages, wherein each of said packages includes provision for attaching a single fixed-function device and a single field-programmable gate array device; and wherein said field programmable gate array device has a different logic capacity for each member of said family; and wherein said fixed function device is identical to that on each of the other packages in said family; and wherein said fixed function device includes a software-programmable processor; and wherein for each integrated circuit package in said family, said field programmable device is mounted on the top side of said integrated circuit package and said fixed function prototype device is mounted on the bottom side; and wherein each package of said packages has I/O connections leaving the package; and wherein the I/O connections for all integrated circuit packages within said family are compatible in terms of I/O functionality and footprint such that one member of said family can always be substituted for other members of said family when mounted in the same physical location on a user's board level circuit.

14. The family of integrated circuit packages of claim 13 wherein said field programmable gate array device is a packaged device.

* * * * *